United States Patent
Toprac et al.

(10) Patent No.: US 6,470,230 B1
(45) Date of Patent: Oct. 22, 2002

(54) SUPERVISORY METHOD FOR DETERMINING OPTIMAL PROCESS TARGETS BASED ON PRODUCT PERFORMANCE IN MICROELECTRONIC FABRICATION

(75) Inventors: Anthony J. Toprac, Austin, TX (US); Michael L. Miller, Cedar Park, TX (US); Thomas Sonderman, Austin, TX (US)

(73) Assignee: Advanced Micro Devices, Inc., Austin, TX (US)

( * ) Notice: Subject to any disclaimer, the term of this patent is extended or adjusted under 35 U.S.C. 154(b) by 0 days.

(21) Appl. No.: 09/477,464

(22) Filed: Jan. 4, 2000

(51) Int. Cl.⁷ .............................. G06F 19/00
(52) U.S. Cl. ....................... 700/121; 700/182
(58) Field of Search .......... 700/13, 108, 174, 700/109, 121, 222, 175, 182, 101, 91; 73/105; 438/8

(56) References Cited

U.S. PATENT DOCUMENTS

| | | | |
|---|---|---|---|
| 5,711,843 A | | 1/1998 | Jahns ........................ 156/345 |
| 5,859,964 A | * | 1/1999 | Wang et al. .................. 714/48 |
| 5,866,437 A | | 2/1999 | Chen et al. .................... 438/14 |
| 6,041,270 A | | 3/2000 | Steffan et al. .............. 700/121 |
| 6,103,559 A | * | 8/2000 | Gardner et al. ............. 438/183 |
| 6,263,255 B1 | * | 7/2001 | Tan et al. .................... 700/106 |
| 6,288,431 B1 | * | 9/2001 | Iwasa et al. ................ 257/401 |

OTHER PUBLICATIONS

International Search Report dated Apr. 4, 2001 (PCT/US00/32948; TT3093–PCT).
Potts D C: "Manufacturing For Design: Putting Process Control In The Language Of The Designer" 1998 IEEE/SEMI, pp. 187–189, XP002164698, New York, NY.

* cited by examiner

Primary Examiner—Leo Picard
Assistant Examiner—Kidest Bahta
(74) Attorney, Agent, or Firm—Williams, Morgan & Amerson, P.C.

(57) ABSTRACT

A method is provided. for manufacturing, the method including processing a workpiece in a processing step, measuring a parameter characteristic of the processing performed on the workpiece in the processing step, and forming an output signal corresponding to the characteristic parameter measured. The method also includes setting a target value for the processing performed in the processing step based on the output signal.

37 Claims, 11 Drawing Sheets

SUPERVISORY METHOD FOR DETERMINING OPTIMAL PROCESS TARGETS BASED ON PRODUCT PERFORMANCE IN MICROELECTRONIC FABRICATION

BACKGROUND OF THE INVENTION

1. Field of the Invention

This invention relates generally to semiconductor fabrication technology, and, more particularly, to a method for semiconductor fabrication supervision and optimization.

2. Description of the Related Art

There is a constant drive within the semiconductor industry to increase the quality, eliability and throughput of integrated circuit devices, e.g., microprocessors, memory devices, and the like. This drive is fueled by consumer demands for higher quality computers and electronic devices that operate more reliably. These demands have resulted in a continual improvement in the manufacture of semiconductor devices, e.g., transistors, as well as in the manufacture of integrated circuit devices incorporating such transistors. Additionally, reducing defects in the manufacture of the components of a typical transistor also lowers the overall cost per transistor as well as the cost of integrated circuit devices incorporating such transistors.

The technologies underlying semiconductor processing tools have attracted increased attention over the last several years, resulting in substantial refinements. However, despite the advances made in this area, many of the processing tools that are currently commercially available suffer certain deficiencies. In particular, such tools often lack advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These deficiencies can engender nonoptimal control of critical processing parameters, such as throughput accuracy, stability and repeatability, processing temperatures, mechanical tool parameters, and the like. This variability manifests itself as within-run disparities, run-to-run disparities and tool-to-tool disparities that can propagate into deviations in product quality and performance, whereas an ideal monitoring and diagnostics system for such tools would provide a means of monitoring this variability, as well as providing means for optimizing control of critical parameters.

Among the parameters it would be useful to monitor and control are critical dimensions (CDs) and doping levels for transistors (and other semiconductor devices), as well as overlay errors in photolithography. CDs are the smallest feature sizes that particular processing devices may be capable of producing. For example, the minimum widths w of polycrystalline (polysilicon or poly) gate lines for metal oxide semiconductor field effect transistors (MOSFETs or MOS transistors) may correspond to one CD for a semiconductor device having such transistors. Similarly, the junction depth $d_j$ (depth below the surface of a doped substrate to the bottom of a heavily doped source/drain region formed within the doped substrate) may be another CD for a semiconductor device such as an MOS transistor. Doping levels may depend on dosages of ions implanted into the semiconductor devices, the dosages typically being given in numbers of ions per square centimeter at ion implant energies typically given in keV.

However, traditional statistical process control (SPC) techniques are often inadequate to control precisely CDs and doping levels in semiconductor and microelectronic device manufacturing so as to optimize device performance and yield. Typically, SPC techniques set a target value, and a spread about the target value, for the CDs, doping levels, and/or overlay errors in photolithography. The SPC techniques then attempt to minimize the deviation from the target value without automatically adjusting and adapting the respective target values to optimize the semiconductor device performance, as measured by wafer electrical test (WET) measurement characteristics, for example, and/or to optimize the semiconductor device yield and throughput. Furthermore, blindly minimizing non-adaptive processing spreads about target values may not increase processing yield and throughput.

The present invention is directed to overcoming, or at least reducing the effects of, one or more of the problems set forth above.

SUMMARY OF THE INVENTION

In one aspect of the present invention, a method is provided for manufacturing, the method including processing a workpiece in a processing step, measuring a parameter characteristic of the processing performed on the workpiece in the processing step, and forming an output signal corresponding to the characteristic parameter measured. The method also includes setting a target value for the processing performed in the processing step based on the output signal.

In another aspect of the present invention, a computer-readable, program storage device is provided, encoded with instructions that, when executed by a computer, perform a method, the method including processing a workpiece in a processing step, measuring a parameter characteristic of the processing performed on the workpiece in the processing step, and forming an output signal corresponding to the characteristic parameter measured. The method also includes setting a target value for the processing performed in the processing step based on the output signal.

In yet another aspect of the present invention, a computer programmed to perform a method, the method including processing a workpiece in a processing step, measuring a parameter characteristic of the processing performed on the workpiece in the processing step, and forming an output signal corresponding to the characteristic parameter measured. The method also includes setting a target value for the processing performed in the processing step based on the output signal.

BRIEF DESCRIPTION OF THE DRAWINGS

The invention may be understood by reference to the following description taken in conjunction with the accompanying drawings, in which the leftmost significant digit(s) in the reference numerals denote(s) the first figure in which the respective reference numerals appear, and in which:

FIGS. 1–7 schematically illustrate a flow chart for various embodiments of a method for manufacturing according to the present invention;

FIG. 8 schematically illustrates an MOS transistor representative of MOS transistors tested in various embodiments of a method for manufacturing according to the present invention;

FIG. 9 schematically illustrates a method for fabricating a semiconductor device practiced in accordance with the present invention;

FIG. 10 schematically illustrates workpieces being processed using a MOSFET processing tool, using a plurality of control input signals, in accordance with the present invention;

FIGS. 11–12 schematically illustrate one particular embodiment of the process and tool in FIG. 10; and FIG. 13 schematically illustrates one particular embodiment of the method of FIG. 9 as may be practiced with the process and tool of FIGS. 11–12.

Figure 1:
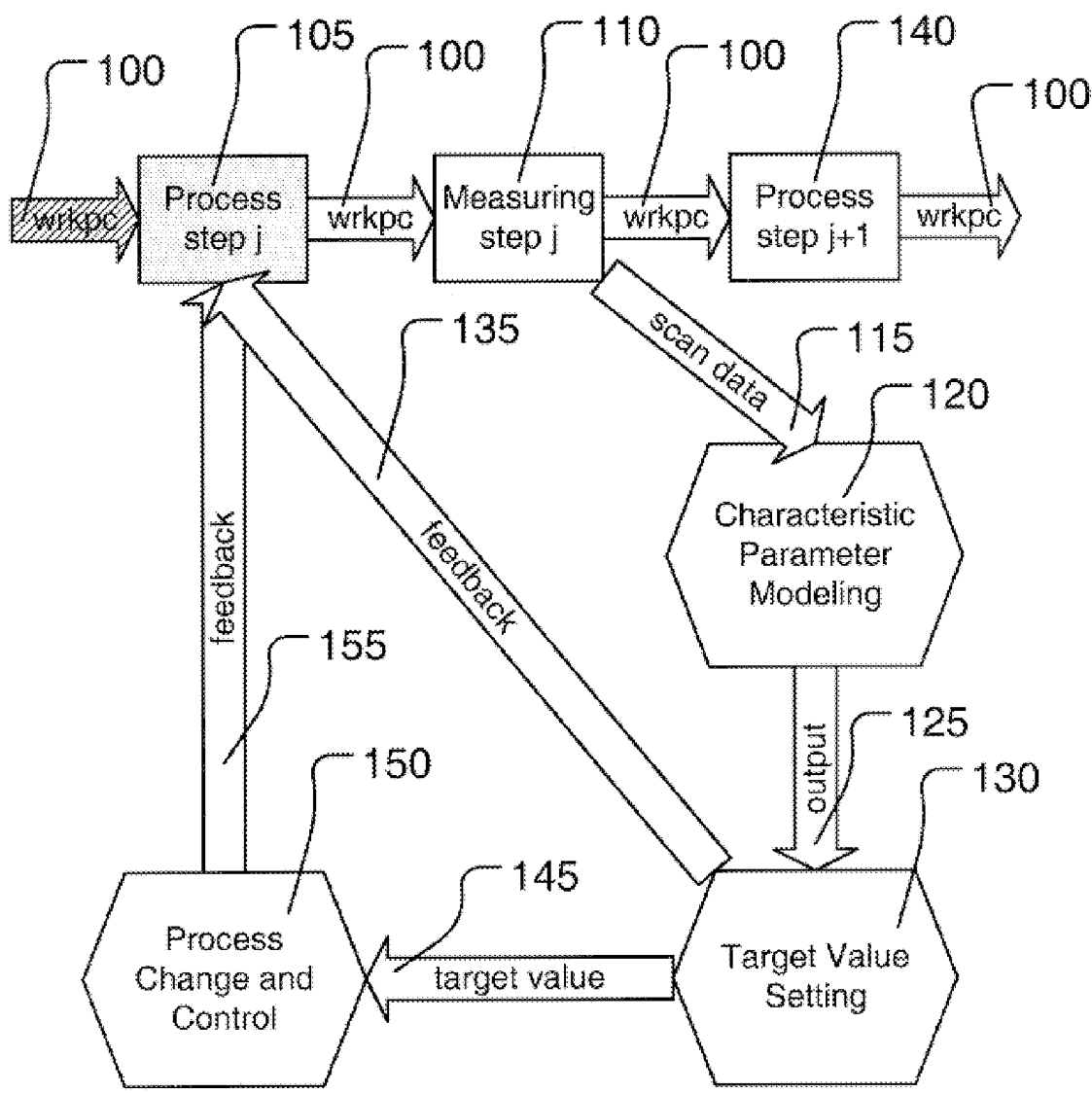
FIGS. 1–13 schematically illustrate various embodiments of a method for manufacturing according to the present invention; and, more particularly.

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF SPECIFIC EMBODIMENTS

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

Illustrative embodiments of a method for manufacturing according to the present invention are shown in FIGS. 1–13. As shown in FIG. 1, a workpiece 100, such as a semiconducting substrate or wafer, having one or more process layers and/or semiconductor devices such as an MOS transistor disposed thereon, for example, is delivered to a processing step j 105, where j may have any value from j=1 to j=N. The total number N of processing steps, such as masking, etching, depositing material and the like, used to form the finished workpiece 100, may range from N=1 to about any finite value.

Figure 2:
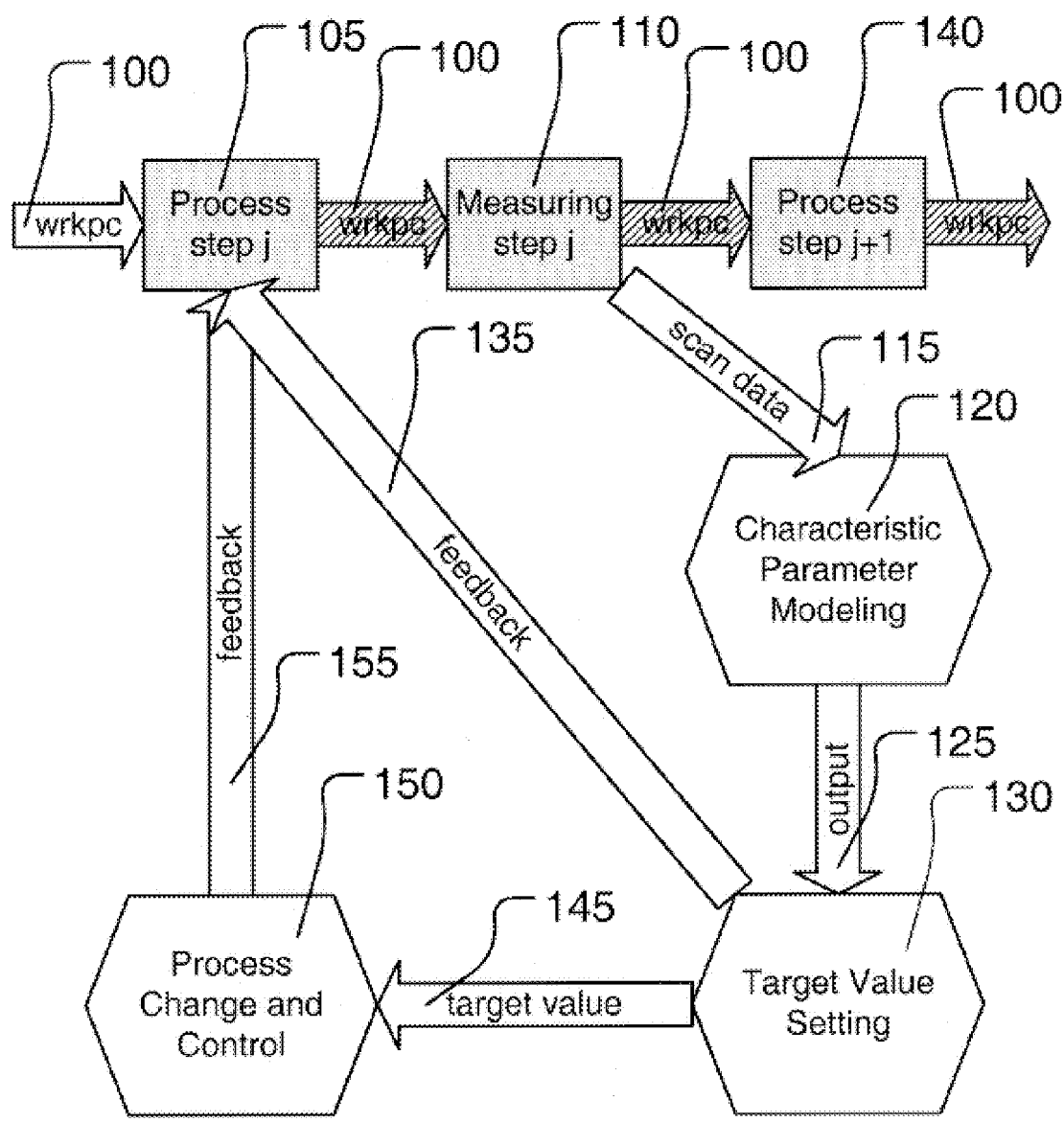

As shown in FIG. 2, the workpiece 100 is sent from the processing step j 105 and delivered to a measuring step j 110. In the measuring step j 110, the workpiece 100 is measured by having a metrology or measuring tool (not shown) measure one or more parameters characteristic of the processing performed in any of the previous processing steps (such as processing step j 105, where j may have any value from j=1 to j=N). The measurements in the measuring step j 110 produce scan data 115 indicative of the one or more characteristic parameters measured in the measuring step j 110. As shown in FIG. 2, if there is further processing to do on the workpiece 100 (if j <N), then the workpiece 100 may be sent from the measuring step j 110 and delivered to a processing step j+1 140 for further processing, and then sent on from the processing step j+1 140.

In various illustrative embodiments, there is no further processing (j=N) and the measuring step j=N 110 may be a wafer electrical test (WET) of the semiconductor device and/or devices and/or process layers formed on the workpiece 100. The WET may measure current and/or voltage responses of MOS transistors formed on the workpiece 100, for example, and/or capacitances and/or resistances of elements of MOS transistors formed on the workpiece 100. For example, the saturation drain-source current $I_{dsat}$ of MOS transistors formed on the workpiece 100 may be measured as an indicator of how fast the MOS transistors formed on the workpiece 100 may be switched from "on" to "off" states.

Figure 3:
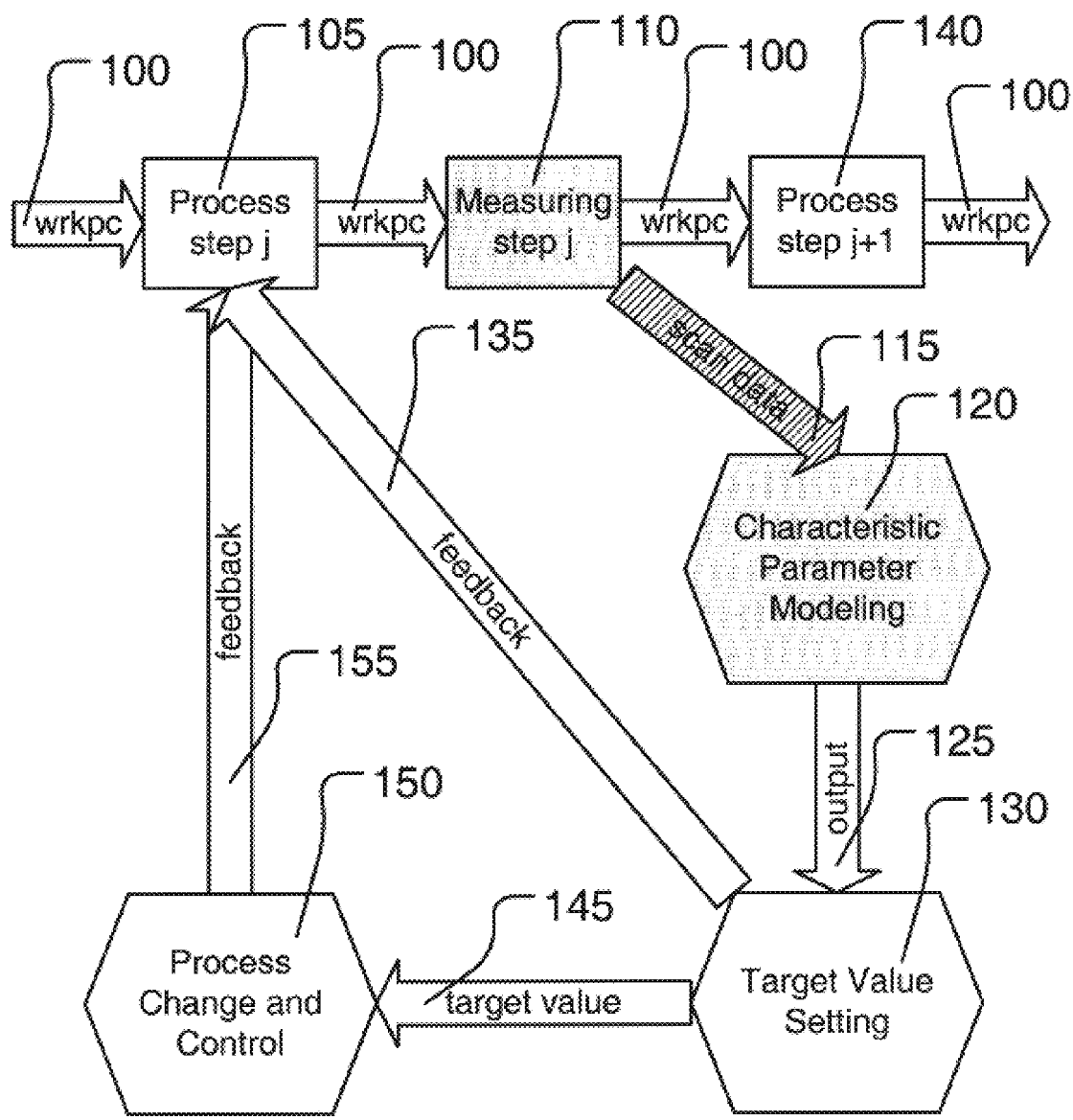

As shown in FIG. 3, the scan data 115 is sent from the measuring step j 110 and delivered to a characteristic parameter modeling step 120. In the characteristic parameter modeling step 120, the one or more characteristic parameters measured in the measuring step j 110 may be input into a characteristic parameter model. The characteristic parameter model may map the one or more characteristic parameters measured in the measuring step j 110 onto one or more parameters that specify the processing performed in any of the previous processing steps (such as processing step j 105, where j may have any value from j=1 to j=N). Delivering the scan data 115 to the characteristic parameter model in the characteristic parameter modeling step 120 produces an output signal 125.

Figure 4:
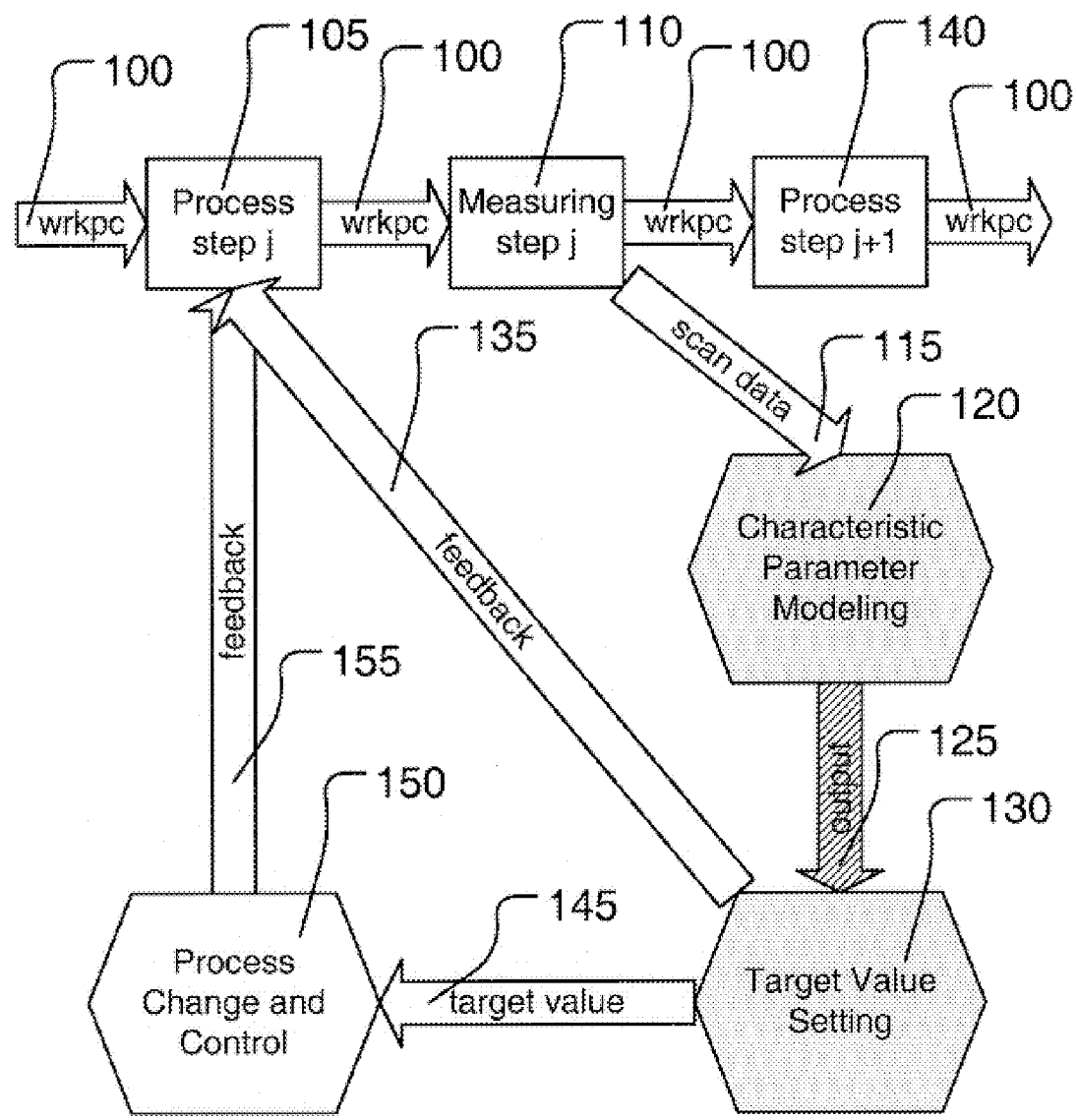

As shown in FIG. 4, the output signal 125 is sent from the characteristic parameter modeling step 120 and delivered to a target value setting step 130. In the target value setting step 130, the characteristic parameter model may be inverted to define one or more changes in the processing performed in any of the previous processing steps (such as processing step j 105, where j may have any value from j=1 to j=N) that need to be made to bring the one or more characteristic parameter values measured in the measuring step j 110 within a range of specification values.

The inversion of the characteristic parameter model (based on the output signal 125) in the target value setting step 130 may be used to alert an engineer of the need to adjust the processing performed any of the previous processing steps (such as processing step j 105, where j may have any value from j=1 to j=N). The engineer may also alter, for example, the type of characteristic parameter modeled in the characteristic parameter modeling z step 120, affecting the output signal 125 produced.

Figure 5:
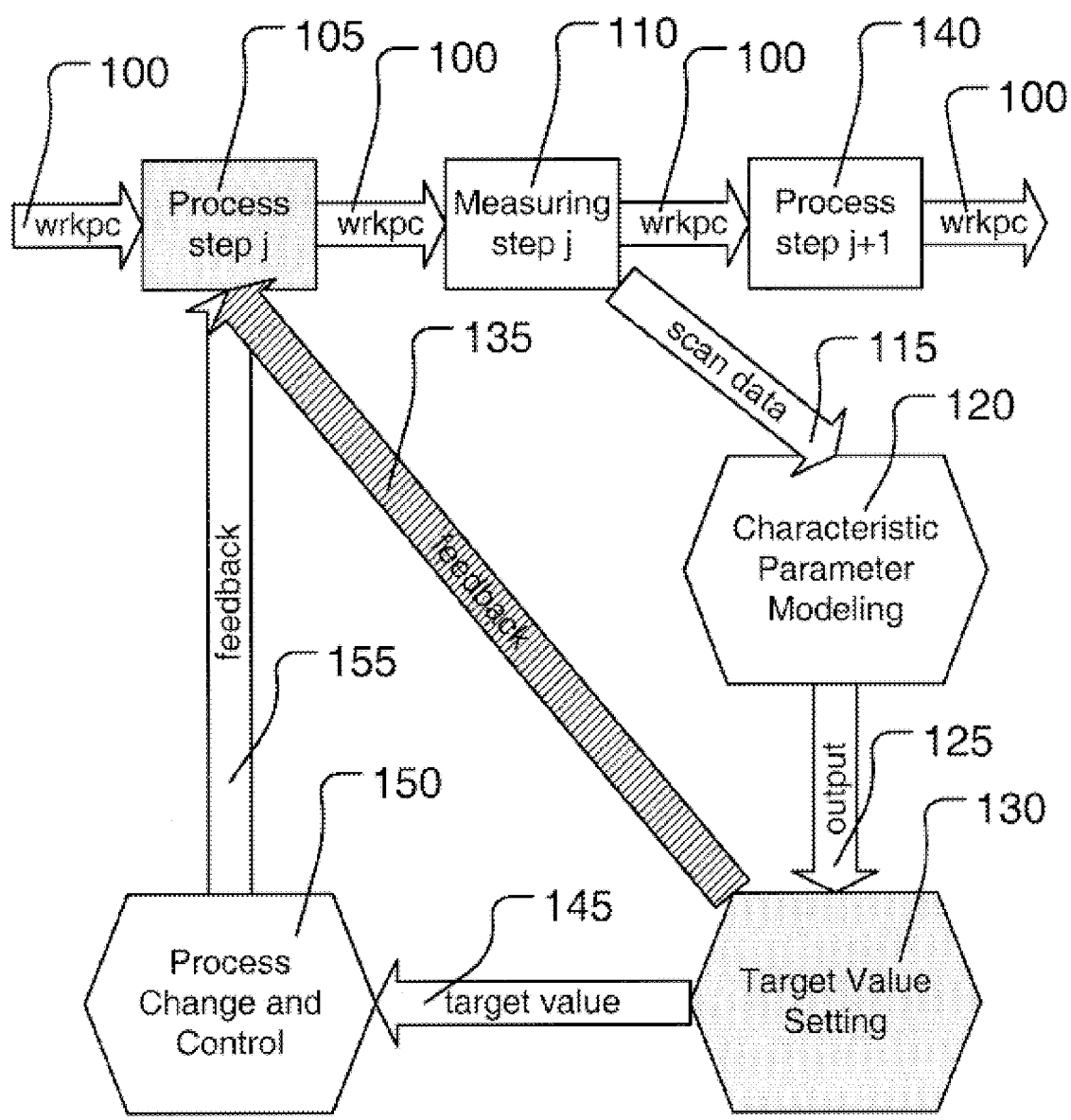

As shown in FIG. 5, a feedback control signal 135 may be sent from the target value setting step 130 to the processing step j 105 to adjust the processing performed in the processing step j 105. In various alternative illustrative embodiments (not shown), the feedback control signal 135 may be sent from the target value setting step 130 to any of the previous processing steps (similar to processing step j 105, where j may have any value from j=1 to j=N) to adjust the processing performed in any of the previous processing steps.

Figure 6:
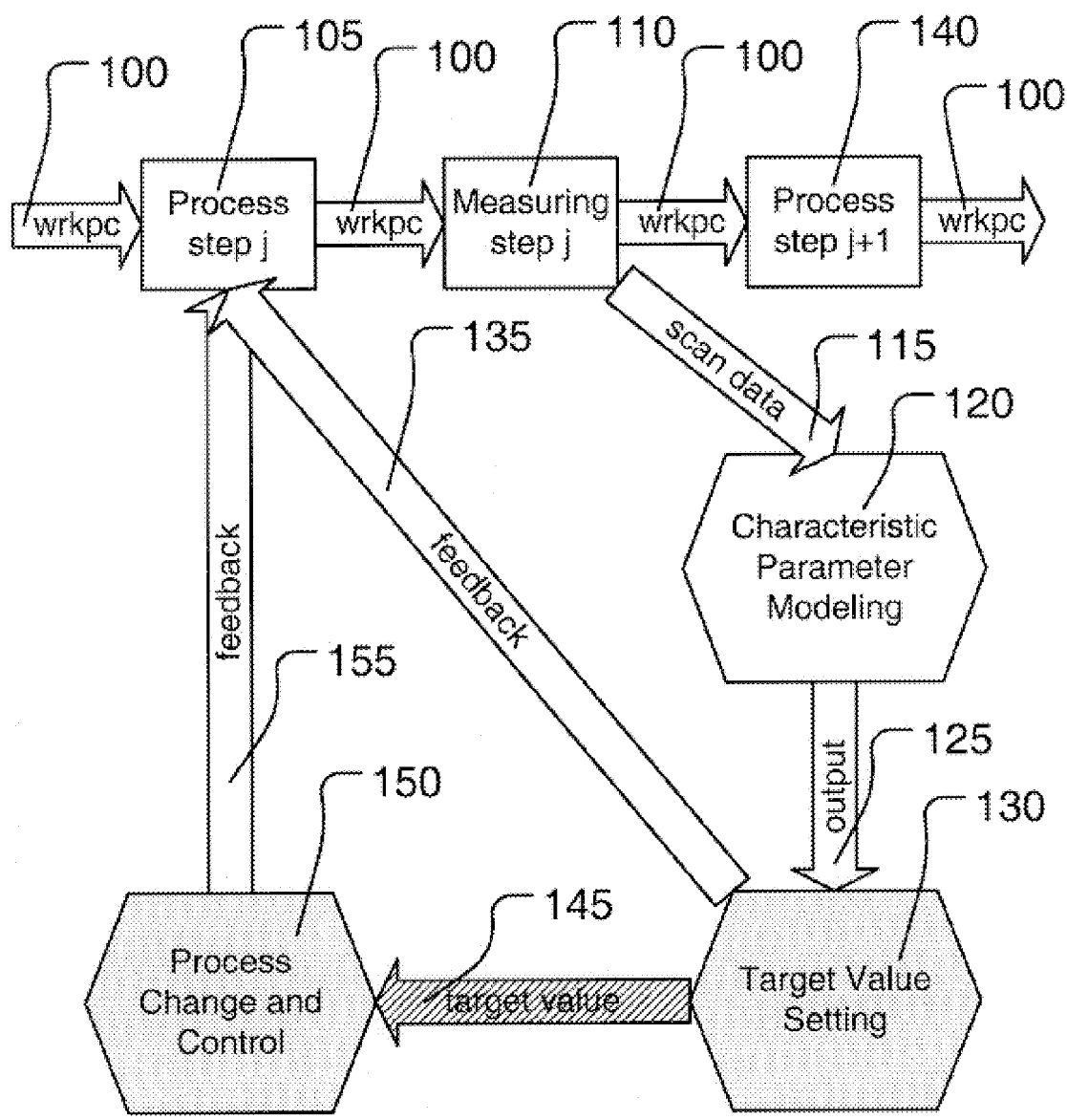
Figure 7:
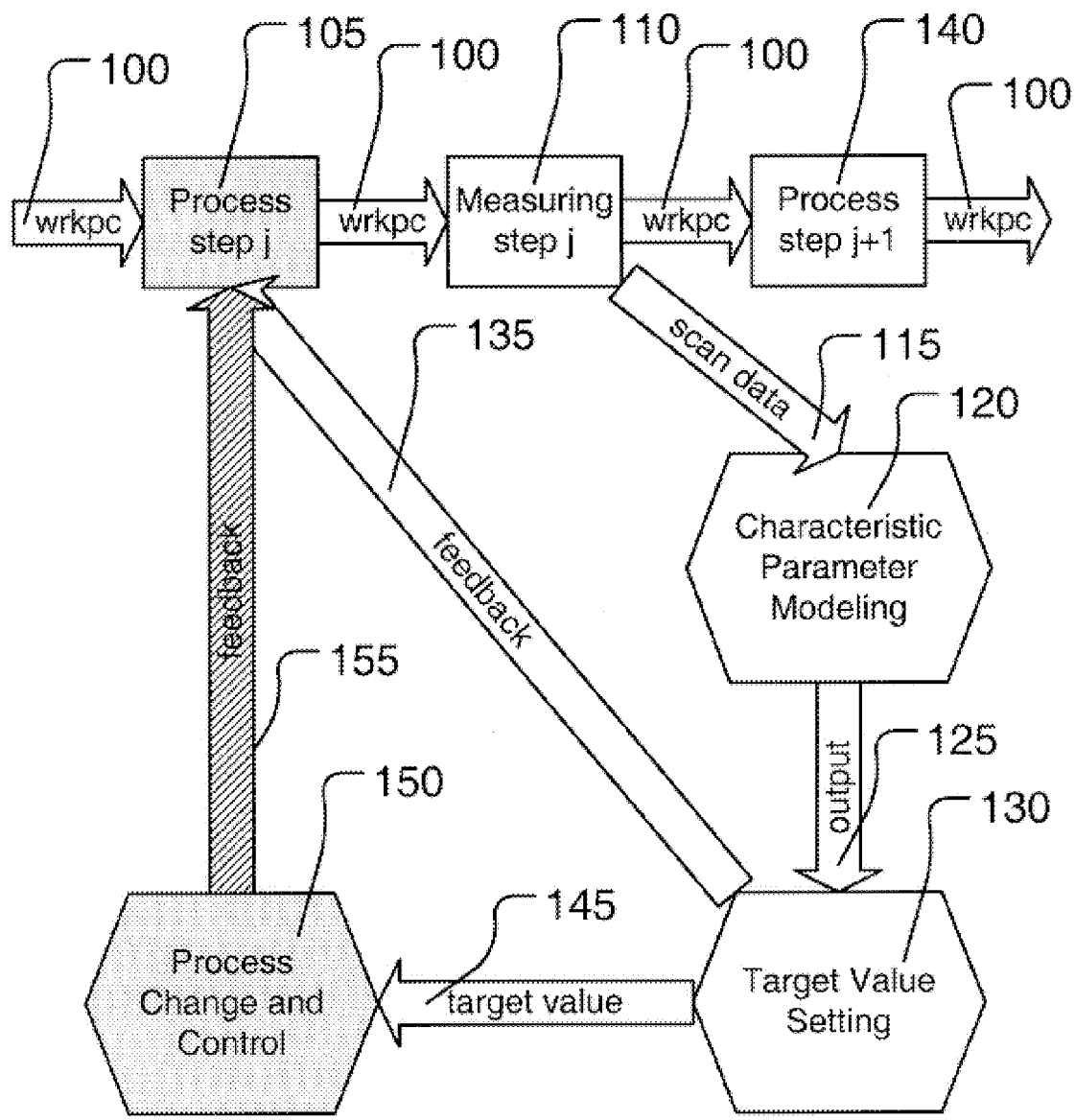

As shown in FIG. 6, in addition to, and/or instead of, the feedback control signal 135, target values 145 may be sent from the target value setting step 130 to a process change and control step 150. In the process change and control step 150, the target values 145 may be used in a high-level supervisory control loop. Thereafter, as shown in FIG. 7, a feedback control signal 155 may be sent from the process change and control step 150 to the processing step j 105 to adjust the processing performed in the processing step j 105. In various alternative illustrative embodiments (not shown), the feedback control signal 155 may be sent from the process change and control step 150 to any of the previous processing steps (similar to processing step j 105, where j may have any value from j=1 to j=N) to adjust the processing performed in any of the previous processing steps. In various illustrative embodiments, output signals from final WET measurements may be used, in conjunction with measurements made at each operation or processing step j 105, where j may have any value from j=1 to j=N, and an invertible transistor model, to change setpoints at one or more of the processing steps j 105 in a supervisory manner such that subsequent production is driven closer to the WET measurement target values.

Figure 8:
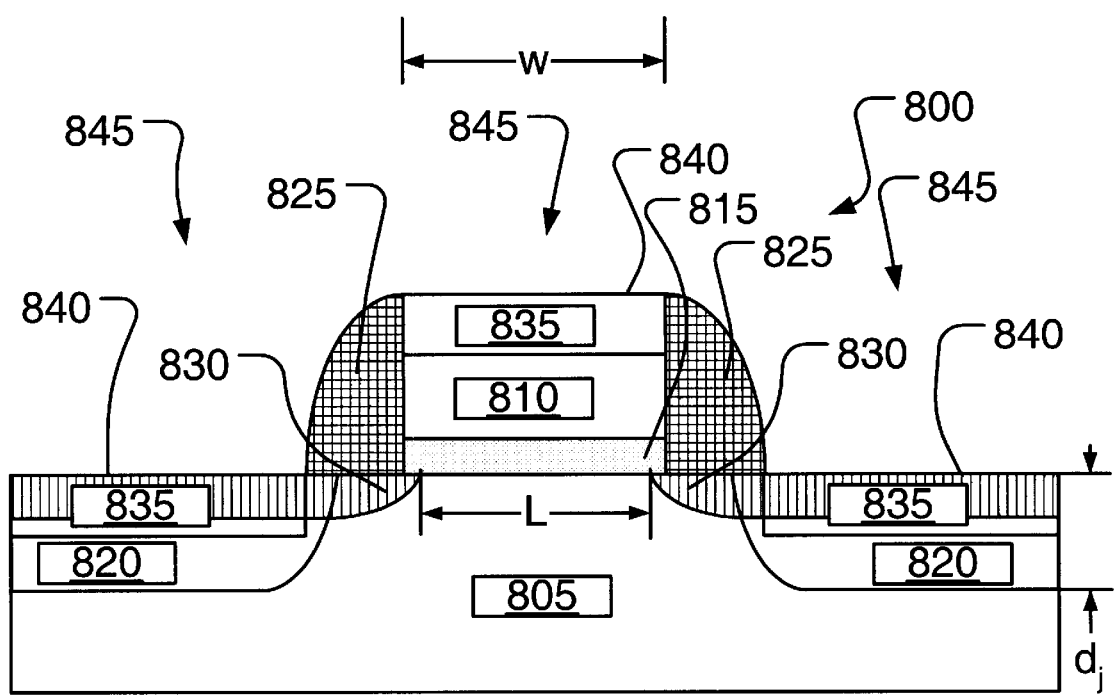

In various illustrative embodiments, as described above, there is no further processing j=N) and the measuring step j=N 110 may be the wafer electrical test (WET) of the semiconductor device and/or devices and/or process layers formed on the workpiece 100. The WET may measure current and/or voltage responses of MOS transistors formed on the workpiece 100, for example, and/or capacitances and/or resistances of elements of MOS transistors formed on the workpiece 100. As shown in FIG. 8, a metal oxide semiconductor field effect transistor (MOSFET or MOS transistor) 800 may be formed on a semiconducting substrate 805, such as doped-silicon. The MOS transistor 800 may have a doped-poly gate 810 formed above a gate oxide 815 formed above the semiconducting substrate 805. The doped-poly gate 810 and the gate oxide 815 may be separated from N$^+$-doped (P$^+$-doped) source/drain regions 820 of the MOS transistor 800 by dielectric spacers 825. The dielectric spacers 825 may be formed. above N-doped (P$^-$-doped) lightly doped drain (LDD) regions 830.

The N$^-$-doped (P$^-$-doped) LDD regions 830 are typically provided to reduce the magnitude of the maximum channel electric field found close to the N$^+$-doped (P$^+$-doped) source/drain regions 820 of the MOS transistor 800, and, thereby, to reduce the associated hot-carrier effects. The lower (or lighter) doping of the N$^-$-doped (P$^-$-doped) LDD regions 830, relative to the N$^+$-doped (P$^+$-doped) source/drain regions 820 of the MOS transistor 800, reduces the magnitude of the maximum channel electric field found close to the N$^+$-doped (P$^+$-doped) source/drain regions 820 of the MOS transistor 800, but increases the source-to-drain resistances of the N$^-$-doped (P$^-$-doped) LDD regions 830.

A titanium (Ti) metal layer (not shown) may have been blanket-deposited on the MOS transistor 800 and then subjected to an initial rapid thermal anneal (RTA) process performed at a temperature ranging from approximately 450–800° C. for a time ranging from approximately 15–60 seconds. At surfaces 840 of active areas 845, such as the N$^+$-doped (P$^+$-doped) source/drain regions 820 and the doped-poly gate 810, exposed Si reacts upon heating with the Ti metal to form a titanium silicide (TiSi$_2$) layer 835 the surfaces 840 of the active areas 845. The Ti metal is not believed to react with the dielectric spacers 825 upon heating. A wet chemical strip of the Ti metal removes excess, unreacted portions (not shown) of the Ti metal layer 235, leaving behind the self-aligned silicided (salicided) TiSi$_2$ layer 835 only at and below the surfaces 840 of the active areas 845. The salicided TiSi$_2$ 835 may then be subjected to a final RTA process performed at a temperature ranging from approximately 800–1000° C. for a time ranging from approximately 10–60 seconds.

As shown in FIG. 8, the MOS transistor 800 may be specified by several processing parameters. For example, the doped-poly gate 810 may have a width w that, in turn, determines a channel length L. The channel length L is the distance between the two metallurgical N$^-$-P (P$^-$-N) junctions formed below the gate oxide 815 for an N-MOS (P-MOS) transistor 800, the two metallurgical N$^-$-P (P$^-$-N) junctions being between the N$^-$-doped (P$^-$-doped) LDD regions 830 and the semiconducting substrate 805. Further, another junction (having a junction depth d$_j$) below the N$^+$-doped (P$^+$-doped) source/drain regions 820 may be formed between the N$^+$-doped (P$^+$-doped) source/drain regions 820 and the semiconducting substrate 805. The semiconducting substrate 805 may have a doping level N$_D$ (N$_A$) reflecting the density of donor (acceptor) impurities typically being given in numbers of ions per square centimeter for an N-type (P-type) semiconducting substrate 805. In addition, the N$^+$-doped (P$^+$-doped) source/drain regions 820 and the N$^-$-doped ($^-$-doped) LDD regions 830 may each have respective doping levels N$_{D+}$ and N$_{D-}$ (N$_{A+}$ and N$_{A-}$). The respective doping levels may depend on dosages of ions implanted into the N$^+$-doped (P$^+$-doped) source/drain regions 820 and the N$^-$-doped (P$^-$-doped) LDD regions 830, the dosages typically being given in numbers of ions per square centimeter at ion implant energies typically given in keV. Further, the gate oxide 815 may have a thickness t$_{ox}$.

The wafer electrical test (WET) of the semiconductor device and/or devices and/or process layers formed on the workpiece 100 that are performed in the measuring step 110 may measure current and/or voltage responses of the MOS transistors 800 formed on the workpiece 100, for example, and/or capacitances and/or resistances of elements of the MOS transistors 800 formed on the workpiece 100. For example, the saturation drain-source current I$_{dsat}$ of MOS transistors formed on the workpiece 100 may be measured as an indicator of how fast the MOS transistors formed on the workpiece 100 may be switched from "on" to "off" states. Similarly, the WET of the MOS transistors 800 formed on the workpiece 100 may measure the drain-source current I$_D$ at different values of the drain voltage V$_D$, gate voltage V$_G$ and/or substrate voltage (or bias) V$_{BS}$. By measuring change in the drain-source current I$_D$ with change in the drain voltage V$_D$, at constant gate voltage V$_G$, the channel conductance g$_D$ may be determined from $$g_D = \left.\frac{\partial I_D}{\partial V_D}\right|_{V_G=const} = \frac{Z}{L}\mu_n C_i f(V_G - V_T),$$

where Z is the channel width (in the direction perpendicular to the plane of the MOS transistor 800 in FIG. 8), $\mu_n$ is the mobility of the electrons (related to the drift velocity v$_{ndrift}$ of the electrons by v$_{ndrift}$=$\mu_n$E where E=V$_D$/L is the electric field across the drain/source), C$_i$ is the capacitance per unit area (C$_i$=$\epsilon_{ox}$/t$_{ox}$ where $\epsilon_{ox}$≈4 is the dielectric constant for the gate oxide 815), and V$_T$ is the threshold voltage of the MOS transistor 800. Similarly, by measuring change in the drain-source current I$_D$ with change in the gate voltage V$_G$, at constant drain voltage V$_D$, the transconductance g$_m$ may be determined from $$g_m = \left.\frac{\partial I_D}{\partial V_G}\right|_{V_D=const} = \frac{Z}{L}\mu_n C_i V_D.$$

Here, the linear region of drain-source current I$_D$ versus drain voltage VD is used, where $$I_D \approx \left(\frac{Z}{L}\right)\mu_n C_i (V_G - V_T)V_D, \text{ for } V_D \ll (V_G - V_T),$$

and the threshold voltage $V_T$ is given by $$V_T = 2\psi_B + \frac{\sqrt{2\epsilon_s q N_A (2\psi_B)}}{C_i},$$

where $\psi_B$ is the potential difference between the Fermi level $E_F$ in the doped-poly gate 810 and the intrinsic (flat-band) Fermi level $E_{Fi}$ in the P-type semiconducting substrate 805, $\epsilon_s$ is the dielectric constant for the P-type semiconducting substrate 805, q is the absolute value of the electric charge on an electron (q=1.60218×10$^{-19}$ Coulombs), and the doping level $N_A$ reflects the density of acceptor impurities for the P-type semiconducting substrate 805. In general, the effective drain-source current $I_D$ may be a complicated function of various variables that themselves may be functions of various other variables, and so forth: $I_{D,eff}=f(V_T, L_{eff}, \ldots)$ and $I_{D,eff}=f(V_T, L_{eff}, \ldots)=f(V_T, L_{eff}(\text{gateCD}, \text{spacerwidth}, \ldots), \ldots)$.

In various illustrative embodiments, characteristic parameters $Y_\alpha$, $\alpha=1$ to $\alpha=m$, obtained using in-line process metrology, may be mapped to measured WET values $x_\beta$, $\beta=1$ to $\beta=n$, in the completed workpiece 100 by the mapping $T^{-1}(y_\alpha)=x_\beta$. The characteristic parameters $y_\alpha$, $\alpha=1$ to $\alpha=m$, may be represented as m vectors each having s components, or, equivalently, as an s×m matrix $Y_{s\times m}$, whose m columns are the m vectors $y_\alpha$, $\alpha=1$ to $$\alpha = m: \; Y_{s\times m} = (y_\alpha) = (y_1 \; \cdots \; y_m) = (y_{\beta\alpha}) = \begin{pmatrix} y_{11} & \cdots & y_{1m} \\ \vdots & \ddots & \vdots \\ y_{s1} & \cdots & y_{sm} \end{pmatrix}.$$

Similarly, the measured WET values $x_\beta$, $\beta=1$ to $\beta=n$, may be represented as n vectors each having t components, or, equivalently, as an t×n matrix $X_{t\times n}$, whose n columns are the n vectors $x_\beta$, $\beta=1$ to $\beta=n$:

$$X_{t\times n} = (x_\alpha) = (x_1 \; \cdots \; x_m) = (x_{\beta\alpha}) = \begin{pmatrix} x_{11} & \cdots & x_{1n} \\ \vdots & \ddots & \vdots \\ x_{t1} & \cdots & x_{tn} \end{pmatrix}.$$

In various illustrative embodiments, the mapping $T^{-1}(y_\alpha)=x_\beta$. may be represented as multiplication of the s×m matrix $Y_{s\times m}$ by the t×s matrix $L_{t\times s}$ on the left and by the m×n matrix $R_{m\times n}$, on the right:

$$L_{t\times s} Y_{s\times m} R_{m\times n} = X_{t\times n}$$

$$= \begin{pmatrix} l_{11} & \cdots & l_{1s} \\ \vdots & \ddots & \vdots \\ l_{t1} & \cdots & l_{ts} \end{pmatrix} \begin{pmatrix} y_{11} & \cdots & y_{1m} \\ \vdots & \ddots & \vdots \\ y_{s1} & \cdots & y_{sm} \end{pmatrix} \begin{pmatrix} r_{11} & \cdots & r_{1n} \\ \vdots & \ddots & \vdots \\ r_{m1} & \cdots & r_{mn} \end{pmatrix}$$

$$= \begin{pmatrix} x_{11} & \cdots & x_{1n} \\ \vdots & \ddots & \vdots \\ x_{t1} & \cdots & x_{tn} \end{pmatrix}.$$

The mapping $T^{-1}(y_\alpha)$ $x_\beta$ of the characteristic parameters $y_\alpha$, $\alpha=1$ to $\alpha=m$, obtained using in-line process metrology, onto the measured WET values $x_\beta$, $\beta=1$ to $\beta=n$, in the completed workpiece 100 may be used on-line to detect and/or correct errant processing that might cause the completed workpiece 100 to be consigned to WET scrap, thereby reducing wasted material and increasing throughput of corrected completed workpieces 100. For example, in various illustrative embodiments, the mapping $T^{-1}(y_\alpha)=x_\beta$ may be inverted $y_\alpha=T(x_\beta)$ to define one or more changes in the processing performed in any of the previous processing steps (such as processing step j 105, where j may have any value from j=1 to j=N) that need to be made to bring the one or more characteristic parameter values $Y_\alpha$, $\alpha=1$ to $\alpha=m$, measured in the measuring step j 110 within a range of specification values.

In various illustrative embodiments, Partial Least-Squares (PLS) modeling may be used to effect the mapping $T^{-1}(y_\alpha)=x_\beta$ of the characteristic parameters $y_\alpha$, $\alpha=1$ to $\alpha=m$, obtained using in-line process metrology, onto the predicted WET resulting values $x_\beta$, $\beta=1$ to $\beta=n$, in the completed workpiece 100. In various alternative illustrative embodiments, Principal Components Analysis (PCA) modeling may be used to effect the mapping $T^{-1}(y_\alpha)=x_\beta$ of the characteristic parameters $Y_\alpha$, $\alpha=1$ to $\alpha=m$, obtained using in-line process metrology, onto the predicted WET resulting values $x_\beta$, $\beta=1$ to $\beta=n$, in the completed workpiece 100.

In one illustrative embodiment of the present invention, characteristic metrology may be performed at each operation or processing step (such as processing step j 105, where j may have any value from j=1 to j=N) for a given lot of workpieces (such as workpiece 100), or for specific workpieces within each lot, and the results of the characteristic metrology performed may be stored in a database. In some cases, the data stored in the database will be the latest characterization or "qualification" data for the particular processing tool at a given operation or processing step (such as processing step j 105, where j may have any value from j=1 to j=N). This is especially the case where direct metrology of the particular process performed on the workpiece is inaccurate or infeasible, such as in the case of film resistivity measurements following a rapid thermal anneal (RTA). In such cases, characterization or qualification data from an unpatterned wafer substrate or other non-product or test wafer may be stored as characteristic process information for that given lot.

These metrology data results may be represented as a vector i of inputs (where i=$i_1$, $i_2$, $i_3$, . . . , $i_j$, . . . , $i_N$) that completely specify the inputs required for a transistor model T(i)=o. Each of the components of the vector i of inputs may be a function of the measurements made by the metrology tools. For example, a simplified vector i of inputs (where i=$i_1$ and $i_2$) may be a function of the resistivity measurements $\rho_{poly}$ and $\rho_{source/drain}$ made by the metrology tools on the poly and source/drain regions, respectively, so that $i_1(\rho_{poly})$ and $i_2(\rho_{source/drain})$ are the poly doping density and source/drain region doping density, respectively. The poly doping and source/drain region doping densities $i_1(\rho_{poly})$ and $i_2(\rho_{source/drain})$, respectively, may be directly put into the transistor model, whereas the respective resistivity measurements $\rho_{poly}$ and $\rho_{source/drain}$ may not be able to be directly put into the transistor model.

Such transistor models are well known in the art, and are available as simulation software from a variety of commercial vendors and non-commercial academic sources. The transistor model used in various illustrative embodiments of the present invention produces outputs that may be represented as a vector o (where o=$o_1$, $o_2$, $o_3$, . . . , $o_k$, . . . , $o_M$). The outputs o from the transistor model may have corresponding values, or may be mapped to corresponding values, or may be associated with corresponding values, of transistor, and other electromagnetic, parametric values measured by test structures on the completed product workpiece (such as workpiece 100 following processing step N 105) at the wafer electrical test (WET).

These corresponding values may be represented as a vector m of measured WET values (where m=$m_1$, $m_2$, $m_3$, ..., $m_k$, ..., $m_M$), with the measured WET values m mapped and/or associated with the transistor model outputs o so that m=F(o) and $F^{-1}$(m)=o. These corresponding values may differ from their respective WET target values by respective WET error values. The specified WET target values may be represented as a vector t (where t=$t_1$, $t_2$, $t_3$, ..., $t_k$, ..., $t_M$), and the WET error values may be represented as a vector e (where e=$e_1$, $e_2$, $e_3$, ..., $e_k$, ..., $e_M$), where e=m−t. (so that $e_k=m_k$'To reduce and/or eliminate this error e=m−t, a corrected WET value $m^{corr}$ may be defined so that $m^{corr}$=m−e=t, and this corrected WET value $m^{corr}$ may be used to define corrected model outputs $o^{corr}$, given by $o^{corr}F^{-1}(m^{corr})$ or $o^{corr}F^{-1}$(m−e) or $o^{corr}=F^{-1}$(t).

The corrected transistor model outputs on may be input to the inverted transistor model to generate respective corrected transistor model inputs $i^{corr}=T^{-1}(o^{corr})=T^{-1}(F^{-1}(t))$. In various illustrative embodiments, the transistor model may be inverted by iterative execution using trial-and-error input values $i^{approx}$ until an input vector is identified that produces the desired corrected transistor model outputs $o^{corr}$ such that $T(i^{approx})=o^{corr}$ to within preset limits. The corrected transistor model inputs $i^{corr}$ may then be applied to any or all of the associated N individual operations or processing steps (such as processing step j 105, where j may have any value from j=1 to j=N) in the wafer fab line as changes, or corrections, to the recipe at the operation or processing step. In various illustrative embodiments, the full correction is applied. In various alternative illustrative embodiments, a partial correction is applied as an "underdamped" control move.

In various alternative illustrative embodiments of the present invention, at least one submodel may be provided that maps recipe variables at an operation or processing step (such as processing step j 105, where j may have any value from j=1 to j=N) to the inputs i that are required by the transistor model. Each such submodel must also be inverted in the feedback mode described above.

For example, in an ion implantation processing step j 105, the recipe variables input to the ion implantation submodel may include the implant current, dose, angle and species. The ion implantation submodel may generate a doping profile $i_j$ that may be put into the transistor model. Following the WET measurements, $i_j^{corr}$ may be generated as described above and $i_j^{corr}$ may be put into the inverted ion implantation submodel to generate required changes, or corrections, to the ion implantation recipe at the ion implantation operation or processing step j 105, such as required changes to the implant current, dose, angle and/or species, needed to bring the WET measurements of successively processed workpieces 100 closer to their respective target values.

In still other various illustrative embodiments of the present invention, constraints on the allowed amount of change in the recipe variables in one or more processing step (such as processing step j 105, where j may have any value from j=1 to j=N) may be implemented. For example, the critical dimension of the gate may be constrained to lie between a high and a low value. Alternatively, the amount of change in a given control move and/or in a given amount of time may be constrained.

In yet other various illustrative embodiments of the present invention, weightings and/or penalties may determine which variable and/or variables are preferentially manipulated relative to other manipulated variables during one or more control moves applied to one or more processing step (such as processing step j 105, where j may have any value from j=1 to j=N). For example, in various illustrative embodiments, it may be preferred to adjust the gate critical dimension rather than to adjust the doping level of the source/drain region, so the gate critical dimension variable may have a greater weight than the doping level variable. Similarly, in various alternative embodiments, it may be preferred to adjust the doping level of the source/drain region rather than to adjust the gate critical dimension, so the gate critical dimension variable may have a greater penalty associated with it than the doping level variable.

In various alternative illustrative embodiments of the present invention, the inputs i and/or the outputs o of the transistor model may be appropriately weighted, and/or the variables and/or functions that parameterize the transistor model may be suitably weighted, so that the predictions and/or outputs o of the transistor model match the corresponding values of the WET measurements better. These weightings may preferably be applied to the inputs i. Alternatively, these weightings may be applied to the outputs o. Additionally, these weightings may be updated and/or adapted to improve the match of the transistor model data to the WET measurements as part of the control scheme.

In still other various illustrative embodiments of the present invention, a feedforward method may be applied. Process results from one or more processing steps (such as processing step j 105, where j may have any value from j=1 to j=N) that deviate from nominal may be applied to a transistor model along with nominal values for process steps not yet performed. The deviation of the transistor model outputs from nominal may then be used as a measure of error as described above, and may be used to determine desirable changes to the recipe(s) of subsequent step(s) so that the identified error may be wholly or at least partially compensated.

The WET measurements, represented generally by a vector x (here β=n=1 for $x_β$), such as those given above, may be put into an MOS transistor model, represented generally by a function T(x), which maps the WET measurements x into a set of parameters, represented generally by a vector y (here α=m=1 for $y_α$), characteristic of the processing performed in at least one of the processing steps j 105, where j may have any value from j=1 to j=N, so that T(x)=y. The transistor model may be inverted, represented generally by a function $T^{-1}$(y)=x, which maps the characteristic processing parameters y into the WET measurements x.

For example, one illustrative embodiment of an MOS transistor model function T(x) gives the minimum channel length $L_{min}$ (related to the doped-poly gate 810 width w) for which long-channel subthreshold behavior can be observed. In this illustrative embodiment, the MOS transistor model function T(x) gives the minimum channel length $L_{min}$ by the simple empirical relation: $L_{min}=0.4[d_j t_{ox}(W_S+W_D)^2]^{1/3}$, measured in μm, where the junction depth $d_j$ is measured in μm, the gate oxide 815 thickness $t_{ox}$ is the numerical value of the number of Å units (so the dimensions work out), and ($W_S+W_D$) is the sum of the source and drain depletion depths, respectively, also measured in μm. In a one-dimensional abrupt junction formulation, the source depletion depth $W_S$ may be given by:

$$W_S = \sqrt{\frac{2\epsilon_s}{qN_A}(V_{bi} + V_{BS})}$$

and the drain depletion depth $W_D$ may be given by:

$$W_D = \sqrt{\frac{2\epsilon_S}{qN_A}(V_D + V_{bi} + V_{BS})},$$

where and $V_{bi}$ is the built-in voltage of the junction.

Another illustrative embodiment of an MOS transistor model function T(x) gives the minimum channel length $L_{min}$ by the more complicated empirical relation: $L_{min}=Af_1(\delta V_T/\delta V_D)[f_2(t_{ox})+B][f_3(W_S+W_D)+C][f_4(d_j)+D]$, where the functions $f_i$, for i=1,2,3,4, and the constants A, B, C, D, may be determined by fitting this equation for the minimum channel length $L_{min}$ to device simulations. For example, $f_1(\delta V_T/\delta V_D)=(\delta V_T/\delta V_D)^{-0.37}$, $f_2(t_{ox})=t_{ox}$, $f_3(W_S+W_D)=W_S+W_D$, $f_4(d_j)=d_j$, A=2.2 $\mu m^{-2}$, B=0.012 $\mu m$, C=0.15 $\mu m$, and D=2.9 $\mu m$ appear to give a good fit. In this illustrative embodiment, the inverted MOS transistor model function $T^{-1}(y)$ gives the variation $(\delta V_T/\delta V_D)$ of the threshold voltage $V_T$ with the drain voltage $V_D$, for example, by the more complicated empirical relation: $\delta V_T/\delta V_D = f_1^{-1}(L_{min}/\{A[f_2(t)+B][f_3(W_S+W_D)+C][f_4(d_j)+D]\})$. For the fit where $f_1(\delta V_T/\delta V_D)=(\delta V_T/\delta V_D)^{-0.37}$, $f_1^{-1}(y)=(y)^{-1/(0.37)}$, for example.

In various illustrative embodiments, the engineer may be provided with advanced process data monitoring capabilities, such as the ability to provide historical parametric data in a user-friendly format, as well as event logging, real-time graphical display of both current processing parameters and the processing parameters of the entire run, and remote, i.e., local site and worldwide, monitoring. These capabilities may engender more optimal control of critical processing parameters, such as throughput accuracy, stability and repeatability, processing temperatures, mechanical tool parameters, and the like. This more optimal control of critical processing parameters reduces this variability. This reduction in variability manifests itself as fewer within-run disparities, fewer run-to-run disparities and fewer tool-to-tool disparities. This reduction in the number of these disparities that can propagate means fewer deviations in product quality and performance. In such an illustrative embodiment of a method of manufacturing according to the present invention, a monitoring and diagnostics system may be provided that monitors this variability and optimizes control of critical parameters.

Figure 9:
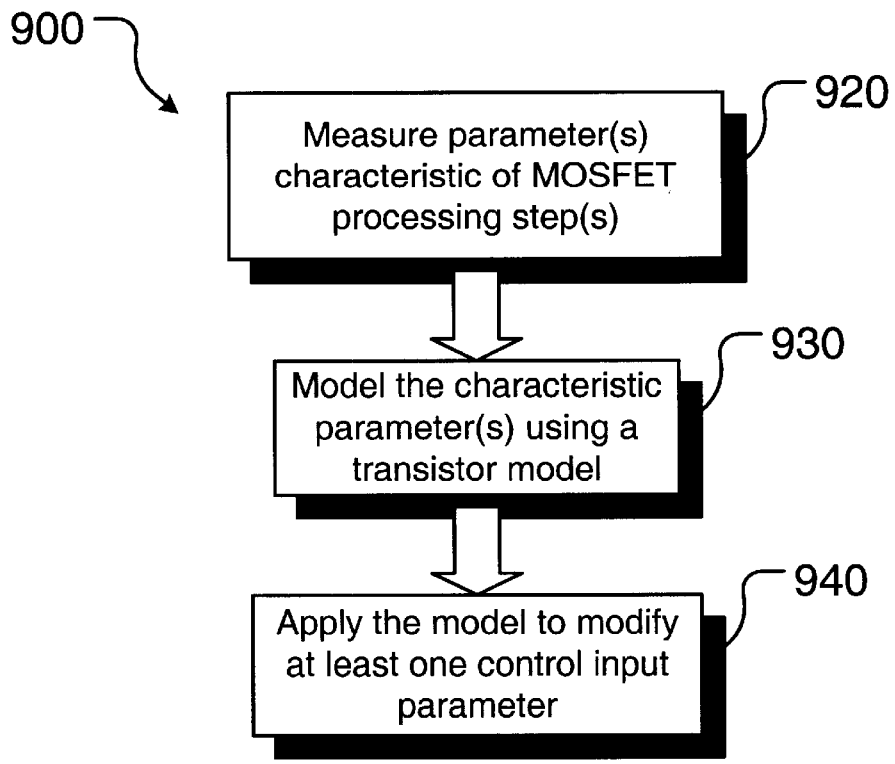
Figure 10:
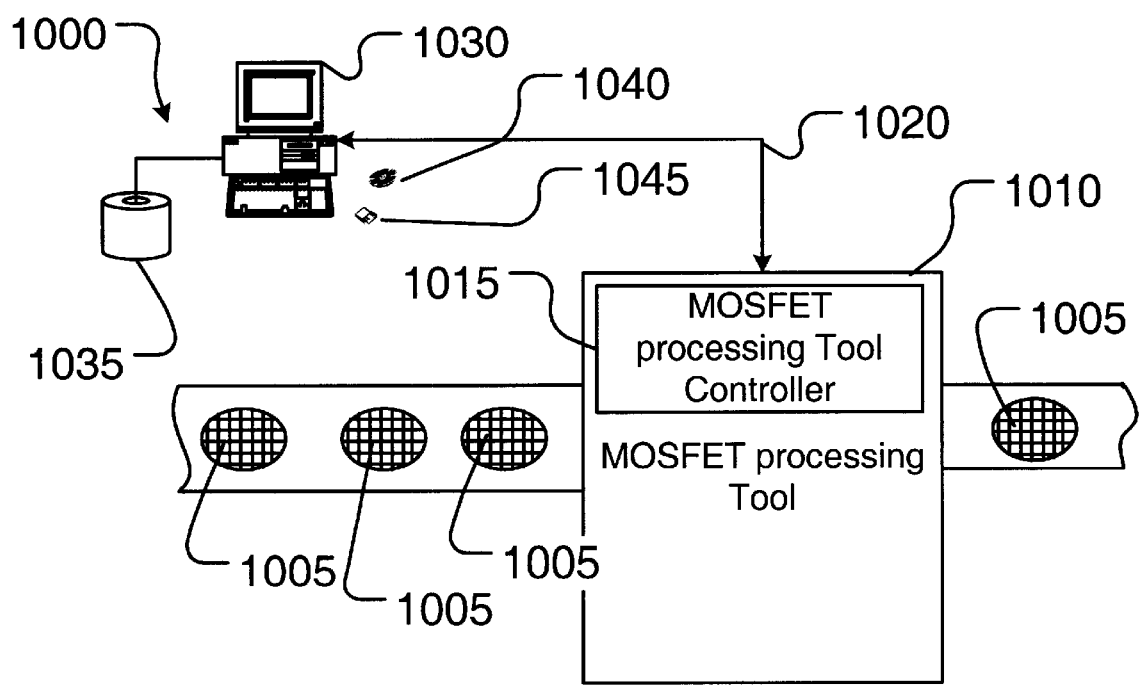

FIG. 9 illustrates one particular embodiment of a method 900 practiced in accordance with the present invention. FIG. 10 illustrates one particular apparatus 1000 with which the method 900 may be practiced. For the sake of clarity, and to further an understanding of the invention, the method 900 shall be disclosed in the context of the apparatus 1000. However, the invention is, not so limited and admits wide variation, as is discussed further below.

Referring now to both FIGS. 9 and 10, a batch or lot of workpieces or wafers 1005 is being processed through a MOSFET processing tool 1010. The MOSFET processing tool 1010 may be any MOSFET processing tool known to the art, such as an ion implanter, a process layer deposition and/or etching tool, a photolithography tool, and the like, provided it includes the requisite control capabilities. The MOSFET processing tool 1010 includes a MOSFET processing tool controller 1015 for this purpose. The nature and function of the MOSFET processing tool controller 1015 will be implementation specific.

For instance, the MOSFET processing tool controller 1015 may control MOSFET processing control input parameters such as MOSFET processing recipe control input parameters. As shown in FIG. 8, the MOS transistor 800 may be specified by several processing parameters. For example, the doped-poly gate 810 may have a width w that, in turn, determines a channel length L. The channel length L is the distance between the two metallurgical $N^-$-P ($P^-$-N) junctions formed below the gate oxide 815 for an N-MOS (P-MOS) transistor 800, the two metallurgical $N^-$-P ($P^-$-N) junctions being between the N-doped ($P^-$-doped) LDD regions 830 and the semiconducting substrate 805. Further, another junction (having a junction depth $d_j$) below the $N^+$-doped ($P^+$-doped) source/drain regions 820 may be formed between the $N^+$-doped ($P^+$-doped) source/drain regions 820 and the semiconducting substrate 805. The semiconducting substrate 805 may have a doping level $N_D$ ($N_A$) reflecting the density of donor (acceptor) impurities typically being given in numbers of ions per square centimeter for an N-type (P-type) semiconducting substrate 805. In addition, the $N^+$-doped ($P^+$-doped) source/drain regions 820 and the $N^-$-doped ($P^-$-doped) LDD regions 830 may each have respective doping levels $N_{D+}$ and $N_{D-}$ ($N_{A+}$ and $N_{A-}$). The respective doping levels may depend on dosages of ions implanted into the $N^+$-doped ($P^+$-doped) source/drain regions 820 and the $N^-$-doped ($P^-$-doped) LDD regions 830, the dosages typically being given in numbers of ions per square centimeter at ion implant energies typically given in keV. Further, the gate oxide 815 may have a thickness $t_{ox}$. Four workpieces 1005 are shown in FIG. 10, but the lot of workpieces or wafers, i.e., the "wafer lot," may be any practicable number of wafers from one to any finite number.

The method 900 begins, as set forth in box 920, by measuring a parameter characteristic of the MOSFET processing performed on the workpiece 1005 in the MOSFET processing tool 1010. The nature, identity, and measurement of characteristic parameters will be largely implementation specific and even tool specific. For instance, capabilities for monitoring process parameters vary, to some degree, from tool to tool. Greater sensing capabilities may permit wider latitude in the characteristic parameters that are identified and measured and the manner in which this is done. Conversely, lesser sensing capabilities may restrict this latitude. For example, a gate poly etch MOSFET processing tool reads the gate critical dimension of a workpiece 1005, and/or an average of the gate critical dimensions of the workpieces 1005 in a lot, using a metrology tool (not shown). The gate critical dimension of a workpiece 1005, and/or an average of the gate critical dimensions of the workpieces 1005 in a lot, is an illustrative example of a parameter characteristic of the MOSFET processing performed on the workpiece in the MOSFET processing tool 1010.

Turning to FIG. 10, in this particular embodiment, the MOSFET processing process characteristic parameters are measured and/or monitored by tool sensors (not shown). The outputs of these tool sensors are transmitted to a computer system 1030 over a line 1020. The computer system 1030 analyzes these sensor outputs to identify the characteristic parameters.

Returning, to FIG. 9, once the characteristic parameter is identified and measured, the method 900 proceeds by modeling the measured and identified characteristic parameter, as set forth in box 930. The computer system 1030 in FIG. 10 is, in this particular embodiment, programmed to model the characteristic parameter. The manner in which this modeling occurs will be implementation specific.

In the embodiment of FIG. 10, a database 1035 stores a plurality of models that might potentially be applied, depending upon which characteristic parameter is measured.

This particular embodiment, therefore, requires some a priori knowledge of the characteristic parameters that might be measured. The computer system 1030 then extracts an appropriate model from the database 1035 of potential models to apply to the measured characteristic parameters. If the database 1035 does not include an appropriate model, then the characteristic parameter may be ignored, or the computer system 1030 may attempt to develop one, if so programmed. The database 1035 may be stored on any kind of computer-readable, program storage medium, such as an optical disk 1040, a floppy disk 1045, or a hard disk drive (not shown) of the computer system 1030. The database 1035 may also be stored on a separate computer system (not shown) that interfaces with the computer system 1030.

Modeling of the measured characteristic parameter may be implemented differently in alternative embodiments. For instance, the computer system 1030 may be programmed using some form of artificial intelligence to analyze the sensor outputs and controller inputs to develop a model on-the-fly in a real-time implementation. This approach might be a useful adjunct to the embodiment illustrated in FIG. 10, and discussed above, where characteristic parameters are measured and identified for which the database 1035 has no appropriate model.

The method 900 of FIG. 9 then proceeds by applying the model to modify a MOSFET processing control input parameter, as set forth in box 940. Depending on the implementation, applying the model may yield either a new value for the MOSFET processing control input parameter or a correction to the existing MOSFET processing control input parameter. The new MOSFET processing control input is then formulated from the value yielded by the model and is transmitted to the MOSFET processing tool controller 1015 over the line 1020. The MOSFET processing tool controller 1015 then controls subsequent MOSFET processing process operations in accordance with the new MOSFET processing control inputs.

Some alternative embodiments may employ a form of feedback to improve the modeling of characteristic parameters. The implementation of this feedback is dependent on several disparate facts, including the tool's sensing capabilities and economics. One technique for doing this would be to monitor at least one effect of the model's implementation and update the model based on the effect(s) monitored. The update may also depend on the model. For instance, a linear model may require a different update than would a non-linear model, all other factors being the same.

As is evident from the discussion above, some features of the present invention are implemented in software. For instance, the acts set forth in the boxes 920–940 in FIG. 9 are, in the illustrated embodiment, software-implemented, in whole or in part. Thus, some features of the present invention are implemented as instructions encoded on a computer-readable, program storage medium. The program storage medium may be of any type suitable to the particular implementation. However, the program storage medium will typically be magnetic, such as the floppy disk 1045 or the computer 1030 hard disk drive (not shown), or optical, such as the optical disk 1040. When these instructions are executed by a computer, they perform the disclosed functions. The computer may be a desktop computer, such as the computer 1030. However, the computer might alternatively be a processor embedded in the MOSFET processing tool 1010. The computer might also be a laptop, a workstation, or a mainframe in various other embodiments. The scope of the invention is not limited by the type or nature of the program storage medium or computer with which embodiments of the invention might be implemented.

Thus, some portions of the detailed descriptions herein are, or may be, presented in terms of algorithms, functions, techniques, and/or processes. These terms enable those skilled in the art most effectively to convey the substance of their work to others skilled in the art. These terms are here, and are generally, conceived to be a self-consistent sequence of steps leading to a desired result. The steps are those requiring physical manipulations of physical quantities. Usually, though not necessarily, these quantities take the form of electromagnetic signals capable of being stored, transferred, combined, compared, and otherwise manipulated.

It has proven convenient at times, principally for reasons of common usage, to refer to these signals as bits, values, elements, symbols, characters, terms, numbers, and the like. All of these and similar terms are to be associated with the appropriate physical quantities and are merely convenient labels applied to these quantities and actions. Unless specifically stated otherwise, or as may be apparent from the discussion, terms such as "processing," "computing," "calculating," "determining," "displaying," and the like, used herein refer to the action(s) and processes of a computer system, or similar electronic and/or mechanical computing device, that manipulates and transforms data, represented as physical (electromagnetic) quantities within the computer system's registers and/or memories, into other data similarly represented as physical quantities within the computer system's memories and/or registers and/or other such information storage, transmission and/or display devices.

Figure 11:
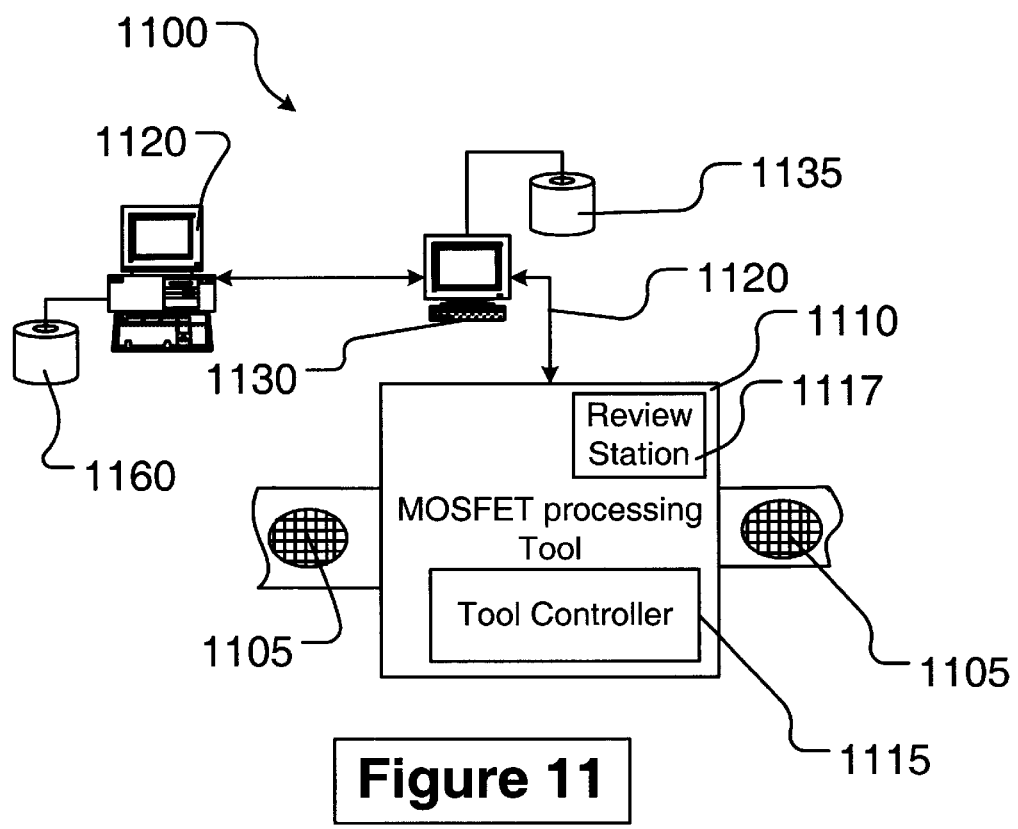
Figure 12:
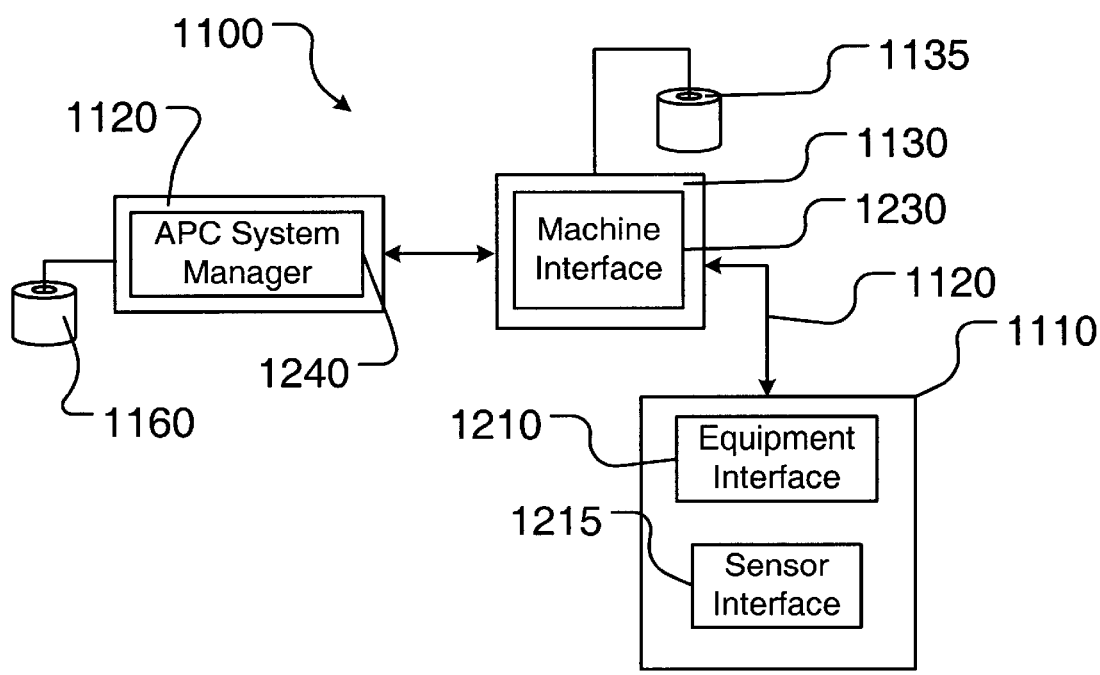

Construction of an Illustrative Apparatus. An exemplary embodiment 1100 of the apparatus 1000 in FIG. 10 is illustrated in FIGS. 11–12, in which the apparatus 1100 comprises a portion of an Advanced Process Control ("APC") system. FIGS. 11–12 are conceptualized, structural and functional block diagrams, respectively, of the apparatus 1100. A set of processing steps is performed on a lot of wafers 1105 on a MOSFET processing tool 1110. Because the apparatus 1100 is part of an APC system, the wafers 1105 are processed on a run-to-run basis. Thus, process adjustments are made and held constant for the duration of a run, based on run-level measurements or averages. A "run" may be a lot, a batch of lots, or even an individual wafer.

In this particular embodiment, the wafers 1105 are processed by the MOSFET processing tool 1110 and various operations in the process are controlled by a plurality of MOSFET processing control input signals on a line 1120 between the MOSFET processing tool 1110 and a workstation 1130. Exemplary MOSFET processing control inputs for this embodiment might include those for the gate critical dimension, the source/drain junction depth, doping profiles, and the like. As described above, and as shown in FIG. 8, the MOS transistor 800 may be specified by several processing parameters. For example, the doped-poly gate 810 may have a width w that, in turn, determines a channel length L. The channel length L is the distance between the two metallurgical $N^-$-P ($P^-$-N) junctions formed below the gate oxide 815 for an N-MOS (P-MOS) transistor 800, the two metallurgical N–P ($P^-$-N) junctions being between the $N^-$-doped ($P^-$-doped) LDD regions 830 and the semiconducting substrate 805. Further, another junction (having a junction depth $d_j$) below the $N^+$-doped ($P^+$-doped) source/drain regions 820 may be formed between the $N^+$-doped ($P^+$-doped) source/drain regions 820 and the semiconducting substrate 805. The semiconducting substrate 805 may have a doping level $N_D$ ($N_A$) reflecting the density of donor (acceptor) impurities typically being given in numbers of ions per square centimeter for an N-type (P-type) semiconducting substrate 805. In addition, the N$^+$-doped (P$^+$-doped) source/drain regions 820 and the N$^-$-doped (P$^-$-doped) LDD regions 830 may each have respective doping levels $N_{D+}$ and $N_{D-}$ ($N_{A+}$ and $N_{A-}$). The respective doping levels may depend on dosages of ions implanted into the N$^+$-doped (P$^+$-doped) source/drain regions 820 N$^-$-doped (P$^-$-doped) LDD regions 830, the dosages typically being given in numbers of ions per square centimeter at ion implant energies typically given in keV. Further, the gate oxide 815 may have a thickness $t_{ox}$.

When a process step in the MOSFET processing tool 1110 is concluded, the semiconductor wafers 1105 being processed in the MOSFET processing tool 1110 are examined in a review station 1117. The MOSFET processing control inputs generally affect the characteristic parameters of the semiconductor wafers 1105 and, hence, the variability and properties of the acts performed by the MOSFET processing tool 1110 on the wafers 1105. Once errors are determined from the examination after the run of a lot of wafers 1105, the MOSFET processing control inputs on the line 1120 are modified for a subsequent run of a lot of wafers 1105. Modifying the control signals on the line 1120 is designed to improve the next process step in the MOSFET processing tool 1110. The modification is performed in accordance with one particular embodiment of the method 900 set forth in FIG. 9, as described more fully below. Once the relevant MOSFET processing control input signals for the MOSFET processing tool 1110 are updated, the MOSFET processing control input signals with new settings are used for a subsequent run of semiconductor devices.

Referring now to both FIGS. 11 and 12, the MOSFET processing tool 1110 communicates with a manufacturing framework comprising a network of processing modules. One such module is an APC system manager 1240 resident on the computer 1140. This network of processing modules constitutes the APC system. The MOSFET processing tool 1110 generally includes an equipment interface 1210 and a sensor interface 1215. A machine interface 1230 resides on the workstation 1130. The machine interface 1230 bridges the gap between the APC framework, e.g., the APC system manager 1240, and the equipment interface 1210. Thus, the machine interface 1230 interfaces the MOSFET processing tool 1110 with the APC framework and supports machine setup, activation, monitoring, and data collection. The sensor interface 1215 provides the appropriate interface environment to communicate with external sensors such as LabView® or other sensor bus-based data acquisition software. Both the machine interface 1230 and the sensor interface 1215 use a set of functionalities (such as a communication standard) to collect data to be used. The equipment interface 1210 and the sensor interface 1215 communicate over the line 1120 with the machine interface 1230 resident on the workstation 1130.

More particularly, the machine interface 1230 receives commands, status events, and collected data from the equipment interface 1210 and forwards these as needed to other APC components and event channels. In turn, responses from APC components are received by the machine interface 1230 and rerouted to the equipment interface 1210. The machine interface 1230 also reformats and restructures messages and data as necessary. The machine interface 1230 supports the startup/shutdown procedures within the APC System Manager 1240. It also serves as an APC data collector, buffering data collected by the equipment interface 1210, and emitting appropriate data collection signals.

In the particular embodiment illustrated, the APC system is a factory-wide software system, but this is not necessary to the practice of the invention. The control strategies taught by the present invention can be applied to virtually any semiconductor MOSFET processing tool on a factory floor. Indeed, the present invention may be simultaneously employed on multiple MOSFET processing tools in the same factory or in the same fabrication process. The APC framework permits remote access and monitoring of the process performance. Furthermore, by utilizing the APC framework, data storage can be more convenient, more flexible, and less expensive than data storage on local drives. However, the present invention may be employed, in some alternative embodiments, on local drives.

The illustrated embodiment deploys the present invention onto the APC framework utilizing a number of software components. In addition to components within the APC framework, a computer script is written for each of the semiconductor MOSFET processing tools involved in the control system. When a semiconductor MOSFET processing tool in the control system is started in the semiconductor manufacturing fab, the semiconductor MOSFET processing tool generally calls upon a script to initiate the action that is required by the MOSFET processing tool controller. The control methods are generally defined and performed using these scripts. The development of these scripts can comprise a significant portion of the development of a control system.

In this particular embodiment, there are several separate software scripts that perform the tasks involved in controlling the MOSFET processing operation. There is one script for the MOSFET processing tool 1110, including the review station 1117 and the MOSFET processing tool controller 1115. There is also a script to handle the actual data capture from the review station 1117 and another script that contains common procedures that can be referenced by any of the other scripts. There is also a script for the APC system manager 1240. The precise number of scripts, however, is implementation specific and alternative embodiments may use other numbers of scripts.

Figure 13:
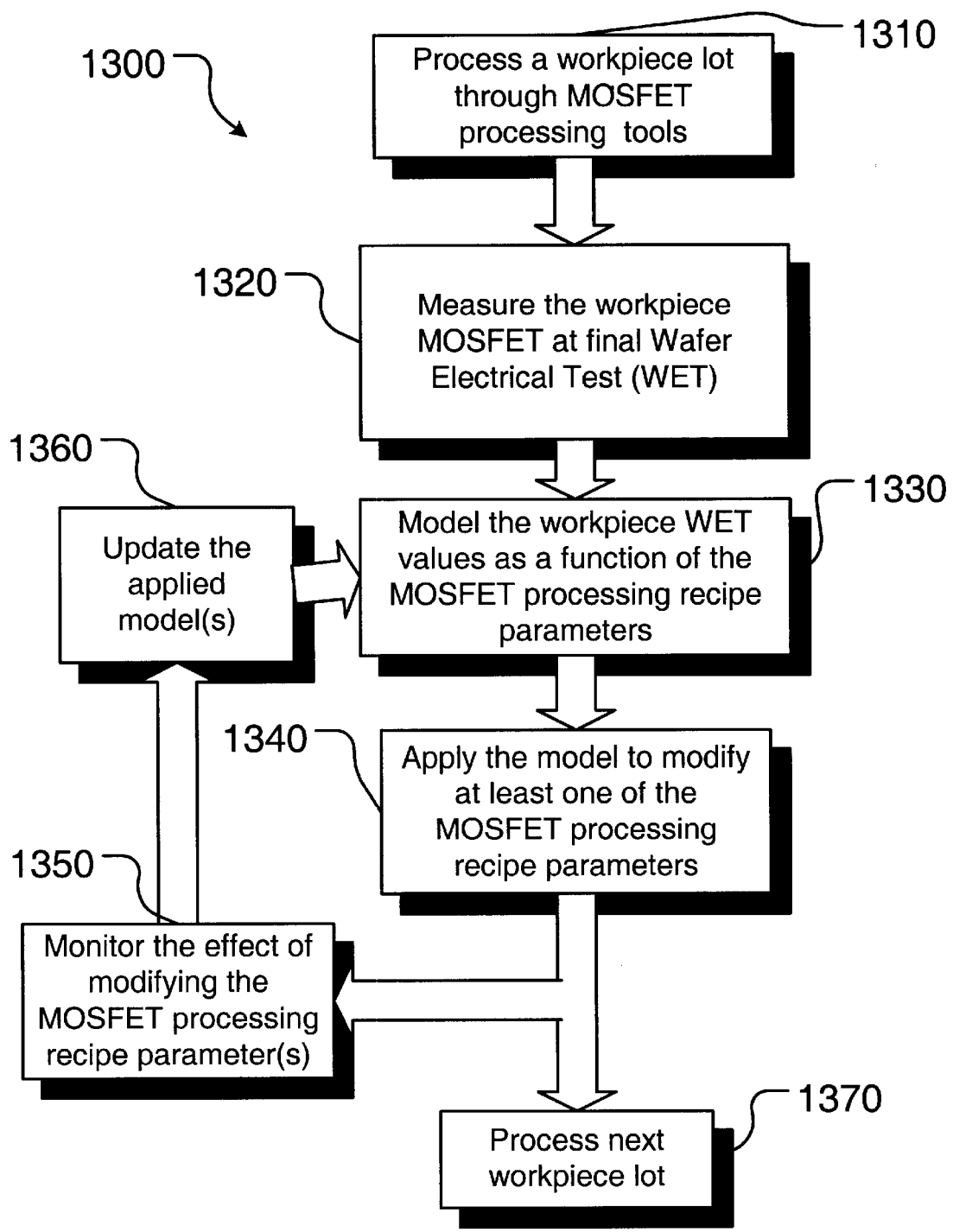

Operation of an Illustrative Apparatus. FIG. 13 illustrates one particular embodiment 1300 of the method 900 in FIG. 9. The method 1300 may be practiced with the apparatus 1100 illustrated in FIGS. 11–12, but the invention is not so limited. The method 1300 may be practiced with any apparatus that may perform the functions set forth in FIG. 13. Furthermore, the method 900 in FIG. 9 may be practiced in embodiments alternative to the method 1300 in FIG. 13.

Referring now to all of FIGS. 11–13, the method 1300 begins with processing a lot of wafers 1105 through MOSFET processing tools, such as the MOSFET processing tool 1110, as set forth in box 1310. In this particular embodiment, the MOSFET processing tool 1110 has been initialized for processing by the APC system manager 1240 through the machine interface 1230 and the equipment interface 1210. In this particular embodiment, before the MOSFET processing tool 1110 is run, the APC system manager script is called to initialize the MOSFET processing tool 1110. At this step, the script records the identification number of the MOSFET processing tool 1110 and the lot number of the wafers 1105. The identification number is then stored against the lot number in a data store 1160. The rest of the script, such as the APCData call and the Setup and StartMachine calls, are formulated with blank or dummy data in order to force the machine to use default settings.

As part of this initialization, the initial setpoints for MOSFET processing control are provided to the MOSFET processing tool controller 1115 over the line 1120. These initial setpoints may be determined and implemented in any suitable manner known to the art. In the particular embodiment illustrated, MOSFET processing controls are implemented by control threads. Each control thread acts like a separate controller and is differentiated by various process conditions. For MOSFET processing control, the control threads are separated by a combination of different conditions. These conditions may include, for example, the semiconductor MOSFET processing tool 1110 currently processing the wafer lot, the semiconductor product, the semiconductor manufacturing operation, and one or more of the semiconductor processing tools (not shown) that previously processed the semiconductor wafer lot.

Control threads are separated because different process conditions affect the MOSFET processing error differently. By isolating each of the process conditions into its own corresponding control thread, the MOSFET processing error can become a more accurate portrayal of the conditions in which a subsequent semiconductor wafer lot in the control thread will be processed. Since the error measurement is more relevant, changes to the MOSFET processing control input signals based upon the error will be more appropriate.

The control thread for the MOSFET processing control scheme depends upon the current MOSFET processing tool, current operation, the product code for the current lot, and the identification number at a previous processing step. The first three parameters are generally found in the context information that is passed to the script from the MOSFET processing tool 1110. The fourth parameter is generally stored when the lot is previously processed. Once all four parameters are defined, they are combined to form the control thread name; MOSP02_OPER01_PROD01_MOSP01 is an example of a control thread name. The control thread name is also stored in correspondence to the wafer lot number in the data store 1160.

Once the lot is associated with a control thread name, the initial settings for that control thread are generally retrieved from the data store 1160. There are at least two possibilities when the call is made for the information. One possibility is that there are no settings stored under the current control thread name. This can happen when the control thread is new, or if the information was lost or deleted. In these cases, the script initializes the control thread assuming that there is no error associated with it and uses the target values of the MOSFET processing errors as the MOSFET processing control input settings. It is preferred that the controllers use the default machine settings as the initial settings. By assuming some settings, the MOSFET processing errors can be related back to the control settings in order to facilitate feedback control.

Another possibility is that the initial settings are stored under the control thread name. In this case, one or more wafer lots have been processed under the same control thread name as the current wafer lot, and have also been measured for MOSFET processing error using the review station 1117. When this information exists, the MOSFET processing control input signal settings are retrieved from the data store 1160. These settings are then downloaded to the MOSFET processing tool 1110.

The wafers 1105 are processed through the MOSFET processing tool 1110. This includes, in the embodiment illustrated, dielectric film or layer etch and/or deposition and/or etch/deposition. The wafers 1105 are measured on the review station 1117 after their MOSFET processing on the MOSFET processing tool 1110. The review station 1117 examines the wafers 1105 after they are processed for a number of errors. The data generated by the instruments of the review station 1117 is passed to the machine interface 1230 via sensor interface 1215 and the line 1120. The review station script begins with a number of APC commands for the collection of data. The review station script then locks itself in place and activates a data available script. This script facilitates the actual transfer of the data from the review station 1117 to the APC framework. Once the transfer is completed, the script exits and unlocks the review station script. The interaction with the review station 1117 is then generally complete.

As will be appreciated by those skilled in the art having the benefit of this disclosure, the data generated by the review station 1117 should be preprocessed for use. Review stations, such as KLA review stations, provide the control algorithms for measuring the control error. Each of the error measurements, in this particular embodiment, corresponds to one of the MOSFET processing control input signals on the line 1120 in a direct manner. Before the error can be utilized to correct the MOSFET processing control input signal, a certain amount of preprocessing is generally completed.

For example, preprocessing may include outlier rejection. Outlier rejection is a gross error check ensuring that the received data is reasonable in light of the historical performance of the process. This procedure involves comparing each of the MOSFET processing errors to its corresponding predetermined boundary parameter. In one embodiment, even if one of the predetermined boundaries is exceeded, the error data from the entire semiconductor wafer lot is generally rejected.

To determine the limits of the outlier rejection, thousands of actual semiconductor manufacturing fabrication ("fab") data points are collected. The standard deviation for each error parameter in this collection of data is then calculated. In one embodiment, for outlier rejection, nine times the standard deviation (both positive and negative) is generally chosen as the predetermined boundary. This was done primarily to ensure that only the points that are significantly outside the normal operating conditions of the process are rejected.

Preprocessing may also smooth the data, which is also known as filtering. Filtering is important because the error measurements are subject to a certain amount of randomness, such that the error significantly deviates in value. Filtering the review station data results in a more accurate assessment of the error in the MOSFET processing control input signal settings. In one embodiment, the MOSFET processing control scheme utilizes a filtering procedure known as an Exponentially-Weighted Moving Average ("EWMA") filter, although other filtering procedures can be utilized in this context.

One embodiment for the EWMA filter is represented by Equation (1):

$$AVG_N = W*M_c + (1-W)*AVG_P \qquad (1)$$

where
$AVG_N \equiv$ the new EWMA average;
$W \equiv$ a weight for the new average ($AVG_N$);
$M_C \equiv$ the current measurement; and
$AVG_P \equiv$ the previous EWMA average.

The weight is an adjustable parameter that can be used to control the amount of filtering and is generally between zero and one. The weight represents the confidence in the accuracy of the current data point. If the measurement is considered accurate, the weight should be close to one. If there were a significant amount of fluctuations in the process, then a number closer to zero would be appropriate.

In one embodiment, there are at least two techniques for utilizing the EWMA filtering process. The first technique uses the previous average, the weight, and the current measurement as described above. Among the advantages of utilizing the first implementation are ease of use and minimal data storage. One of the disadvantages of utilizing the first implementation is that this method generally does not retain much process information. Furthermore, the previous average calculated in this manner would be made up of every data point that preceded it, which may be undesirable. The second technique retains only some of the data and calculates the average from the raw data each time.

The manufacturing environment in the semiconductor manufacturing fab presents some unique challenges. The order that the semiconductor wafer lots are processed through an MOSFET processing tool may not correspond to the order in which they are read on the review station. This could lead to the data points being added to the EWMA average out of sequence. Semiconductor wafer lots may be analyzed more than once to verify the error measurements. With no data retention, both readings would contribute to the EWMA average, which may be an undesirable characteristic. Furthermore, some of the control threads may have low volume, which may cause the previous average to be outdated such that it may not be able to accurately represent the error in the MOSFET processing control input signal settings.

The MOSFET processing tool controller 1115, in this particular embodiment, uses limited storage of data to calculate the EWMA filtered error, i.e., the first technique. Wafer lot data, including the lot number, the time the lot was processed, and the multiple error estimates, are stored in the data store 1160 under the control thread name. When a new set of data is collected, the stack of data is retrieved from data store 1160 and analyzed. The lot number of the current lot being processed is compared to those in the stack. If the lot number matches any of the data present there, the error measurements are replaced. Otherwise, the data point is added to the current stack in chronological order, according to the time periods when the lots were processed. In one embodiment, any data point within the stack that is over 128 hours old is removed. Once the aforementioned steps are complete, the new filter average is calculated and stored to data store 1160.

Thus, the data is collected and preprocessed, and then processed to generate an estimate of the current errors in the MOSFET processing control input signal settings. First, the data is passed to a compiled Matlab® plug-in that performs the outlier rejection criteria described above. The inputs to a plug-in interface are the multiple error measurements and an array containing boundary values. The return from the plug-in interface is a single toggle variable. A nonzero return denotes that it has failed the rejection criteria, otherwise the variable returns the default value of zero and the script continues to process.

After the outlier rejection is completed, the data is passed to the EWMA filtering procedure. The controller data for the control thread name associated with the lot is retrieved, and all of the relevant operation upon the stack of lot data is carried out. This includes replacing redundant data or removing older data. Once the data stack is adequately prepared, it is parsed into ascending time-ordered arrays that correspond to the error values. These arrays are fed into the EWMA plug-in along with an array of the parameter required for its execution. In one embodiment, the return from the plug-in is comprised of the six filtered error values.

Returning to FIG. 13, data preprocessing includes measuring workpiece 1105 WET values in a final WET measurement step, as set forth in box 1320. Known, potential characteristic parameters may be identified by characteristic data patterns or may be identified as known consequences of modifications to MOSFET processing control. The example of how changes in gate critical dimension affect deposition variability of the etch/deposited dielectric film given above falls into this latter category.

The next step in the control process is to calculate the new settings for the MOSFET processing tool controller 1115 of the MOSFET processing tool 1110. The previous settings for the control thread corresponding to the current wafer lot are retrieved from the data store 1160. This data is paired along with the current set of MOSFET processing errors. The new settings are calculated by calling a compiled Matlab® plug-in. This application incorporates a number of inputs, performs calculations in a separate execution component, and returns a number of outputs to the main script. Generally, the inputs of the Matlab® plug-in are the MOSFET processing control input signal settings, the review station errors, an array of parameters that are necessary for the control algorithm, and a currently unused flag error. The outputs of the Matlab® plug-in are the new controller settings, calculated in the plug-in according to the controller algorithm described above.

A MOSFET processing process engineer or a control engineer, who generally determines the actual form and extent of the control action, can set the parameters. They include the threshold values, maximum step sizes, controller weights, and target values. Once the new parameter settings are calculated, the script stores the setting in the data store 1160 such that the MOSFET processing tool 1110 can retrieve them for the next wafer lot to be processed. The principles taught by the present invention can be implemented into other types of manufacturing frameworks.

Returning again to FIG. 13, the calculation of new settings includes, as set forth in box 1330, modeling the workpiece 1105 WET values as a function of the MOSFET processing recipe parameters. This modeling may be performed by the Matlab® plug-in. In this particular embodiment, only known, potential characteristic parameters are modeled and the models are stored in a database 1135 accessed by a machine interface 1230. The database 1135 may reside on the workstation 1130, as shown, or some other part of the APC framework. For instance, the models might be stored in the data store 1160 managed by the APC system manager 1240 in alternative embodiments. The model will generally be a mathematical model, i.e., an equation describing how the change(s) in MOSFET processing recipe control(s) affects the MOSFET processing performance and the WET measurements in the final WET, and the like. The transistor models, and/or processing step submodel(s), described in various illustrative embodiments given above are examples of such models.

The particular model used will be implementation specific, depending upon the particular MOSFET processing tool 1110 and the particular characteristic parameter being modeled. Whether the relationship in the model is linear or non-linear will be dependent on the particular parameters involved.

The new settings are then transmitted to and applied by the MOSFET processing tool controller 1115. Thus, returning now to FIG. 13, once the workpiece 1105 WET values are modeled, the model is applied to modify at least one MOSFET processing recipe control input parameter, as set forth in box 1340. In this particular embodiment, the machine interface 1230 retrieves the model from the database 1135, plugs in the respective value(s), and determines the necessary change(s) in the MOSFET processing recipe control input parameter(s). The change is then communicated by the machine interface 1230 to the equipment interface 1210 over the line 1120. The equipment interface 1210 then implements the change.

The present embodiment furthermore provides that the models be updated. This includes, as set forth in boxes 1350–1360 of FIG. 13, monitoring at least one effect of modifying the MOSFET processing recipe control input parameters (box 1350) and updating the applied model (box 1360) based on the effect(s) monitored. For instance, various aspects of the MOSFET processing tool 1110's operation will change as the MOSFET processing tool 1110 ages. By monitoring the effect of the MOSFET processing recipe change(s) implemented as a result of the characteristic parameter (e.g., workpiece 1105 gate critical dimension) measurement, the necessary value could be updated to yield superior performance.

As noted above, this particular embodiment implements an APC system. Thus, changes are implemented "between" lots. The actions set forth in the boxes 1320–1360 are implemented after the current lot is processed and before the second lot is processed, as set forth in box 1370 of FIG. 13. However, the invention is not so limited. Furthermore, as noted above, a lot may constitute any practicable number of wafers from one to several thousand (or practically any finite number). What constitutes a "lot" is implementation specific, and so the point of the fabrication process in which the updates occur will vary from implementation to implementation.

Any of the above-disclosed embodiments of a method of manufacturing according to the present invention enables the use of central values and spreads of parametric measurements sent from measuring tools and/or a wafer electrical test (WET) to make supervisory processing adjustments, either manually and/or automatically, to improve and/or better control the yield. Additionally, any of the above-disclosed embodiments of a method of manufacturing according to the present invention enables semiconductor device fabrication with increased device accuracy and precision, increased efficiency and increased device yield, enabling a streamlined and simplified process flow, thereby decreasing the complexity and lowering the costs of the manufacturing process and increasing throughput.

The particular embodiments disclosed above are illustrative only, as the invention may be modified and practiced in different but equivalent manners apparent to those skilled in the art having the benefit of the teachings herein. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed is:

1. A method of manufacturing, the method comprising:
    processing a workpiece in a processing step;
    measuring a parameter characteristic of the processing performed on the workpiece in the processing step;
    performing a parameter characteristic modeling process in response to the measuring the parameter characteristic;
    forming an output signal based upon the parameter characteristic modeling process; and
    setting a target value as a feedback for the processing performed in the processing step based on the output signal.

2. The method of claim 1, wherein measuring the characteristic parameter includes measuring a wafer electrical test (WET) parameter value of a transistor.

3. The method of claim 2, wherein forming the output signal corresponding to the characteristic parameter measured includes using the WET parameter value measured as an input to a transistor model.

4. The method of claim 3, wherein setting the target value for the processing performed in the processing step based on the output signal includes inverting the transistor model to define a change in the processing performed in the processing step needed to bring the WET parameter value measured within a range of specification values.

5. The method of claim 4, wherein inverting the transistor model to define the change in the processing performed in the processing step includes defining a change in a critical dimension of a feature formed in the processing step needed to bring the WET parameter value measured within the range of specification values.

6. The method of claim 5, wherein defining the change in the critical dimension of the feature formed in the processing step includes defining the change in the critical dimension of a poly gate line width of an MOS transistor.

7. The method of claim 5, wherein defining the change in the critical dimension of the feature formed in the processing step includes defining the change in the critical dimension of a junction depth of a source/drain region and a structure layer of an MOS transistor.

8. The method of claim 4, wherein inverting the transistor model to define the change in the processing performed in the processing step includes defining a change in a doping level of a feature formed in the processing step needed to bring the WET parameter value measured within the range of specification values.

9. The method of claim 8, wherein defining the change in the doping level of the feature formed in the processing step includes defining the change in the doping level of a source/drain region of an MOS transistor.

10. The method of claim 8, wherein defining the change in the doping level of the feature formed in the processing step includes defining the change in the doping level of a lightly doped drain (LDD) region of an MOS transistor.

11. A method of manufacturing, the method comprising:
    processing a workpiece in first and second processing steps;
    measuring parameters characteristic of the processing performed on the workpiece in the first and second processing steps;
    performing a parameter characteristic modeling process in response to the measuring the parameter characteristic;
    forming an output signal based upon the parameter characteristic modeling process; and
    setting a target value for the processing performed in at least one of the first and second processing steps based on the output signal.

12. The method of claim 11, wherein measuring the characteristic parameters includes measuring at least one wafer electrical test (WET) parameter value of a transistor.

13. The method of claim 12, wherein forming the output signal corresponding to the characteristic parameters measured includes using the at least one WET parameter value measured as an input to a transistor model.

14. The method of claim 13, wherein setting the target value for the processing performed in the at least one of the first and second processing steps based on the output signal includes inverting the transistor model to define a change in the processing performed in the at least one of the first and second processing steps needed to bring the at least one WET parameter value measured within a range of specification values.

15. The method of claim 14, wherein inverting the transistor model to define the change in the processing performed in the at least one of the first and second processing steps includes defining a change in one of a critical dimension and a doping level of a feature formed in the at least one of the first and second processing steps needed to bring the at least one WET parameter value measured within the range of specification values.

16. A method of manufacturing, the method comprising:
processing a workpiece in a plurality of processing steps;
measuring parameters characteristic of the processing performed on the workpiece in the plurality of processing steps after the workpiece has been completely processed;
performing a parameter characteristic modeling process in response to the measuring the parameter characteristic;
forming an output signal based upon the parameter characteristic modeling process; and
setting a target value for the processing performed in at least one of the plurality of processing steps based on the output signal.

17. The method of claim 16, wherein measuring the characteristic parameters includes measuring wafer electrical test (WET) parameter values of a transistor.

18. The method of claim 17, wherein forming the output signal corresponding to the characteristic parameters measured includes using the WET parameter values measured as inputs to a transistor model.

19. The method of claim 18, wherein setting the target value for the processing performed in the processing step based on the output signal includes inverting the transistor model to define a change in the processing performed in the at least one of the plurality of processing steps needed to bring the WET parameter values measured within respective ranges of specification values.

20. The method of claim 19, wherein inverting the transistor model to define the change in the processing performed in the at least one of the plurality of processing steps includes defining a change in a critical dimension of a feature formed in the at least one of the plurality of processing steps needed to bring the WET parameter values measured within the respective ranges of specification values.

21. The method of claim 20, wherein defining the change in the critical dimension of the feature formed in the at least one of the plurality of processing steps includes defining the change in the critical dimension of a poly gate line width of an MOS transistor.

22. The method of claim 20, wherein defining the change in the critical dimension of the feature formed in the at least one of the plurality of processing steps includes defining the change in the critical dimension of a junction depth of a source/drain region and a structure layer of an MOS transistor.

23. The method of claim 19, wherein inverting the transistor model to define the change in the processing performed in the at least one of the plurality of processing steps includes defining a change in a doping level of a feature formed in the at least one of the plurality of processing steps needed to bring the WET parameter values measured within the respective ranges of specification values.

24. The method of claim 23, wherein defining the change in the doping level of the feature formed in the at least one of the plurality of processing steps includes defining the change in the doping level of a source/drain region of an MOS transistor.

25. The method of claim 23, wherein defining the change in the doping level of the feature formed in the at least one of the plurality of processing steps includes defining the change in the doping level of a lightly doped drain (LDD) region of an MOS transistor.

26. The method of claim 20, wherein inverting the transistor model to define the change in the processing performed in the at least one of the plurality of processing steps further includes defining a change in a doping level of a feature formed in the at least one of the plurality of processing steps needed to bring the WET parameter values measured within the respective ranges of specification values.

27. The method of claim 26, wherein defining the change in the critical dimension of the feature formed in the at least one of the plurality of processing steps includes defining the change in the critical dimension of a poly gate line width of an MOS transistor.

28. The method of claim 26, wherein defining the change in the critical dimension of the feature formed in the at least one of the plurality of processing steps includes defining the change in the critical dimension of a junction depth of a source/drain region and a structure layer of an MOS transistor.

29. The method of claim 26, wherein defining the change in the doping level of the feature formed in the at least one of the plurality of processing steps includes defining the change in the doping level of a source/drain region of an MOS transistor.

30. The method of claim 26, wherein defining the change in the doping level of the feature formed in the at least one of the plurality of processing steps includes defining the change in the doping level of a lightly doped drain (LDD) region of an MOS transistor.

31. The method of claim 27, wherein defining the change in the doping level of the feature formed in the at least one of the plurality of processing steps includes defining the change in the doping level of a source/drain region of an MOS transistor.

32. The method of claim 27, wherein defining the change in the doping level of the feature formed in the at least one of the plurality of processing steps includes defining the change in the doping level of a lightly doped drain (LDD) region of an MOS transistor.

33. The method of claim 28, wherein defining the change in the doping level of the feature formed in the at least one of the plurality of processing steps includes defining the change in the doping level of a source/drain region of an MOS transistor.

34. The method of claim 28, wherein defining the change in the doping level of the feature formed in the at least one of the plurality of processing steps includes defining the change in the doping level of a lightly doped drain (LDD) region of an MOS transistor.

35. A computer-readable, program storage device, encoded with instructions that, when executed by a computer, perform a method for manufacturing a workpiece, the method comprising:
processing a workpiece in a processing step;
measuring a parameter characteristic of the processing performed on the workpiece in the processing step;
performing a parameter characteristic modeling process in response to the measuring the parameter characteristic;

forming an output signal based upon the parameter characteristic modeling process; and setting a target value for the processing performed in the processing step based on the output signal.

36. A computer programmed to perform a method of manufacturing, the method comprising:

processing a workpiece in a processing step;

measuring a parameter characteristic of the processing performed on the workpiece in the processing step;

performing a parameter characteristic modeling process in response to the measuring the parameter characteristic;

forming an output signal based upon the parameter characteristic modeling process; and setting a target value for the processing performed in the processing step based on the output signal.

37. An apparatus, comprising:

means for processing a workpiece in a processing step;

means for measuring a parameter characteristic of the processing performed on the workpiece in the processing step;

means for performing a parameter characteristic modeling process in response to the measuring the parameter characteristic;

means for forming an output signal based upon the parameter characteristic modeling process; and means for setting a target value as a feedback for the processing performed in the processing step based on the output signal.

* * * * *